(12) United States Patent
Ohira et al.

(10) Patent No.: US 10,958,042 B2
(45) Date of Patent: Mar. 23, 2021

(54) SEMICONDUCTOR LIGHT-EMITTING DEVICE AND METHOD FOR MANUFACTURING SEMICONDUCTOR LIGHT-EMITTING DEVICE

(71) Applicant: KABUSHIKI KAISHA TOSHIBA, Tokyo (JP)

(72) Inventors: Kazuya Ohira, Tokyo (JP); Hideto Furuyama, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 16/351,699

(22) Filed: Mar. 13, 2019

(65) Prior Publication Data

US 2020/0091683 A1    Mar. 19, 2020

(30) Foreign Application Priority Data

Sep. 19, 2018   (JP) .............................. JP2018-175278

(51) Int. Cl.
  *H01S 5/183* (2006.01)
  *H01S 5/042* (2006.01)
  *H01S 5/343* (2006.01)

(52) U.S. Cl.
  CPC ........ *H01S 5/18377* (2013.01); *H01S 5/0425* (2013.01); *H01S 5/343* (2013.01)

(58) Field of Classification Search
  CPC .... H01S 5/18377; H01S 5/0425; H01S 5/343; H01S 5/2063; H01S 5/18305; H01S 5/02476; H01S 5/04253; H01S 5/18386; H01S 5/105; H01S 5/04257; H01S 5/18308; H01S 5/18375
  See application file for complete search history.

(56) References Cited

U.S. PATENT DOCUMENTS

| | | |
|---|---|---|
| 2015/0288146 A1 | 10/2015 | Chang-Hasnain et al. |
| 2016/0276806 A1 | 9/2016 | Ohira et al. |
| 2018/0048120 A1* | 2/2018 | Yoshida .............. H01S 5/04253 |
| 2019/0109244 A1 | 4/2019 | Furuyama et al. |

FOREIGN PATENT DOCUMENTS

| | | |
|---|---|---|
| JP | 2016-178293 A | 10/2016 |
| JP | 2019-68019 A | 4/2019 |

* cited by examiner

*Primary Examiner* — Yuanda Zhang
(74) *Attorney, Agent, or Firm* — Finnegan, Henderson, Farabow, Garrett & Dunner L.L.P.

(57) ABSTRACT

According to one embodiment, the first process of forming a first light-reflecting structure including forming a patterned dielectric layer on a substrate, forming a first high refractive index layer on the substrate and the dielectric layer, planarizing the first high refractive index layer, forming a mask layer on the first high refractive index layer, forming a periodic structure in the mask layer and the first high refractive index layer, the periodic structure having openings separated at a constant period, forming a low refractive index layer on the mask layer and filling the periodic structure with the low refractive index layer, and performing chemical mechanical polishing to cause the mask layer and the low refractive index layer to form substantially the same plane.

9 Claims, 31 Drawing Sheets

(STEP 1)

(STEP 2)

(STEP 3)

(STEP 4)

(STEP 5)

(STEP 1)

(STEP 2)

(STEP 3)

(STEP 4)

(STEP 5)

SEMICONDUCTOR LIGHT-EMITTING DEVICE AND METHOD FOR MANUFACTURING SEMICONDUCTOR LIGHT-EMITTING DEVICE

CROSS-REFERENCE TO RELATED APPLICATION

This application is based upon and claims the benefit of priority from Japanese Patent Application No. 2018-175278, filed on Sep. 19, 2018; the entire contents of which are incorporated herein by reference.

FIELD

Embodiments described herein relate generally to a semiconductor light-emitting device and a method for manufacturing a semiconductor light-emitting device.

BACKGROUND

Optical semiconductor devices are broadly divided into semiconductor light-emitting devices and semiconductor light-receiving devices. A vertical-cavity surface-emitting laser (VCSEL) device is drawing attention as a semiconductor light-emitting device in recent years, and has a structure in which an optical semiconductor structure including an active layer (a light-emitting layer) is vertically interposed between two membrane reflectors made of photonic crystals.

Such a semiconductor laser device must have good heat dissipation and low strain inside the device structure. In a method for manufacturing a conventional semiconductor light-emitting device, chemical mechanical polishing (CMP) dishing undesirably causes a level difference between the membrane reflector portion and the periphery of the lower membrane reflector; therefore, even if a III-V junction is possible, strain may be generated in this portion. Moreover, there are cases where the dishing amount makes the junction impossible to form; and there is room for improvement.

DETAILED DESCRIPTION

Figure 1:
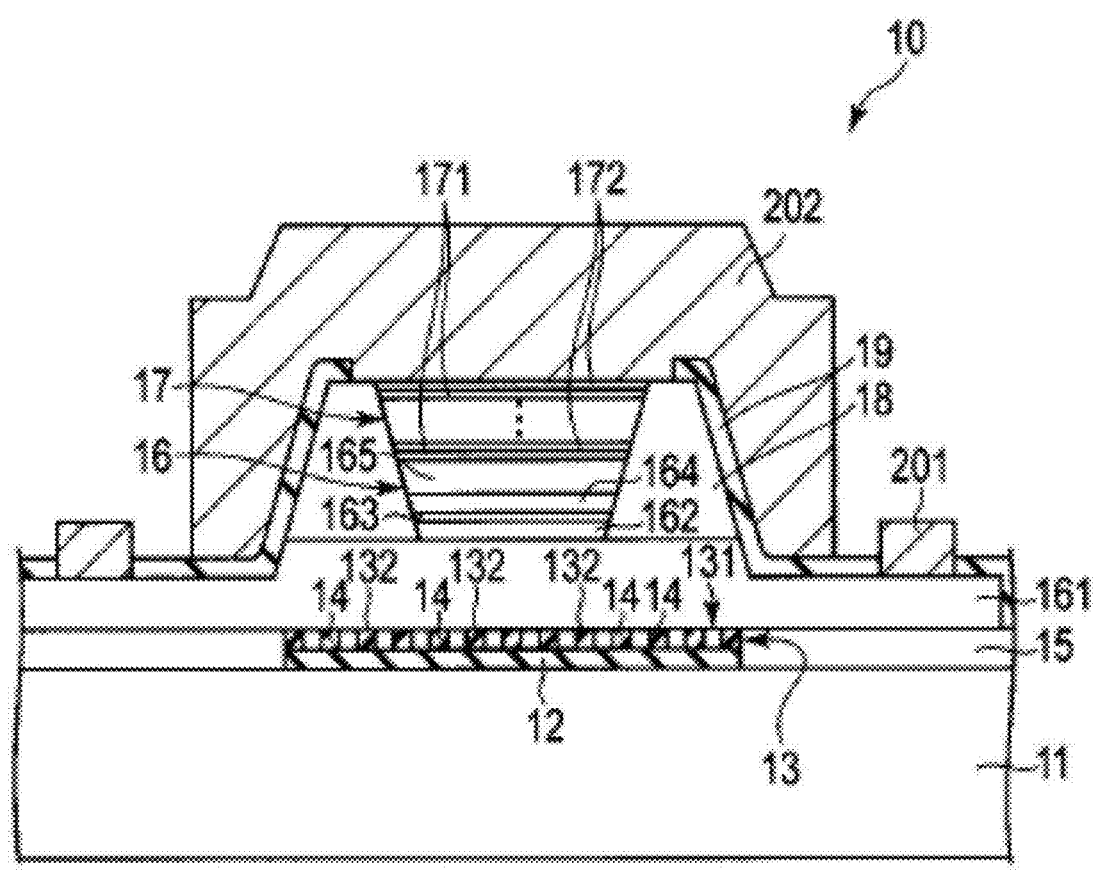
FIG. 1 is a schematic cross-sectional view of a semiconductor light-emitting device manufactured by a method for manufacturing the semiconductor light-emitting device according to a first embodiment.

According to one embodiment, a method for manufacturing a semiconductor light-emitting device includes a first process of forming a first light-reflecting structure, bonding an optical semiconductor structure on the first light-reflecting structure, the optical semiconductor structure including an active layer, forming a second light-reflecting structure on the optical semiconductor structure, and forming a pair of electrodes providing a current to the optical semiconductor structure. The first process including forming a patterned dielectric layer on a substrate, forming a first high refractive index layer on the substrate and the dielectric layer, planarizing the first high refractive index layer, forming a mask layer on the first high refractive index layer, forming a periodic structure in the mask layer and the first high refractive index layer, the periodic structure having openings separated at a constant period, forming a low refractive index layer on the mask layer and filling the periodic structure with the low refractive index layer, and performing chemical mechanical polishing to cause the mask layer and the low refractive index layer to form substantially the same plane.

Various embodiments are described below with reference to the accompanying drawings. Common configurations are marked with the same reference numerals throughout the embodiments; and duplicate descriptions are omitted. The drawings are schematic views for describing and promoting the understanding of the embodiments; and while the configurations, dimensions, ratios, etc., are different from those of the actual devices in places, appropriate design modifications can be made by considering known technology and the description recited below.

First Embodiment

A method for manufacturing a semiconductor light-emitting device according to a first embodiment includes a first process of forming a first light-reflecting structure, a process of bonding an optical semiconductor structure including an active layer on the first light-reflecting structure, a process of forming a second light-reflecting structure on the optical semiconductor structure, and a process of forming a pair of electrodes for providing a current to the optical semiconductor structure; and the first process includes a process of forming a patterned dielectric layer on a substrate, a process of forming a first high refractive index layer on the substrate and the dielectric layer, a process of planarizing the first high refractive index layer, a process of forming a mask layer on the first high refractive index layer, a process of forming a periodic structure in the mask layer and the first high refractive index layer, a process of forming a low refractive index layer on the mask layer and filling the periodic structure with the low refractive index layer, and a process of performing chemical mechanical polishing to cause the mask layer and the low refractive index layer to form substantially the same plane. First, the semiconductor light-emitting device manufactured by the method for manufacturing the semiconductor light-emitting device according to the first embodiment will be described.

FIG. 1 summarily shows a semiconductor light-emitting device 10 manufactured by the method for manufacturing the semiconductor light-emitting device according to the first embodiment. The semiconductor light-emitting device 10 is a vertical-cavity surface-emitting laser (VCSEL) device.

As shown in FIG. 1, the semiconductor light-emitting device 10 includes a substrate 11. The substrate 11 may be a homosubstrate formed of the same type of semiconductor material as a semiconductor of an optical semiconductor structure (a semiconductor light-emitting structure) including an active layer (i.e., a light-emitting layer) formed on the substrate 11; or the substrate 11 may be a heterosubstrate formed of a different type of semiconductor material from the semiconductor of the optical semiconductor structure recited above (e.g., a silicon substrate in the case where the semiconductor of the optical semiconductor structure including the active layer is a Group III-V or Group II-IV compound semiconductor).

A first light-reflecting structure 13 is provided on the substrate 11 with a dielectric layer (e.g., a silicon oxide layer) 12 interposed. The first light-reflecting structure 13 includes a first structure body layer in which the refractive index changes periodically in the in-plane direction. The first light-reflecting structure also is called the first structure body layer. The first structure body layer 13 includes a high refractive index region having a relatively high refractive index and a low refractive index region having a relatively low refractive index that are two-dimensionally arranged periodically. More specifically, the first structure body layer 13 can include a photonic crystal. In other words, in the first structure body layer 13, a high refractive index layer that is made of a material having a high refractive index is used as the main material; and a dielectric material having a lower refractive index than the main material is buried in the main material at a constant spacing. Also, in the first structure body layer 13, the main material may be formed to have a constant spacing; and the dielectric material that has the low refractive index may be disposed in the portions formed as the constant spacing of the main material. Thus, the main material contacts a buried layer described below. Polysilicon and amorphous silicon are examples of the main material; and silicon oxide, silicon nitride, silicon oxynitride, aluminum nitride, aluminum oxide, an ITO layer, an $InTiO_x$ layer, and an $InWO_x$ layer are examples of the dielectric material. In FIG. 1, multiple openings 132 pierce the polysilicon or amorphous silicon included in a main material 131 at a constant spacing; and a dielectric 14 fills the openings 132 inside the polysilicon or amorphous silicon layer 131. A semiconductor layer (hereinbelow, also called the heterosemiconductor layer and the buried layer) 15 which is a different type from the substrate 11 is disposed to surround the first structure body layer 13 included in the first light-reflecting structure. For example, in the case where the substrate 11 is a silicon substrate, the semiconductor layer 15 can be formed of polysilicon, amorphous silicon, etc. The first structure body layer 13 may be disposed so that the front surface of the first structure body layer 13 is included in a surface including the front surface of the heterosemiconductor layer 15; or the first structure body layer 13 may be buried in the heterosemiconductor layer 15. Or, a recess that corresponds to the first structure body layer 13 may be formed inside the substrate 11; and the first structure body layer may be formed inside the recess. Although the front surface of the first structure body layer is included in the surface including the front surface of the substrate 11 in such a case, the front surface of the first structure body layer can be positioned lower than the surface.

If the front surface of the first structure body layer 13 and the front surface of the buried layer 15 are included in substantially the same plane, that is, if the front surface of the first structure body layer 13 and the front surface of the buried layer 15 are substantially coplanar, an optical semiconductor structure 16 (having a flat back surface) can densely contact the entire surface of the coplanar surface when formed on the structure body layer 13 as elaborated below; therefore, the heat that is generated by the optical semiconductor structure 16 is dissipated efficiently via the substrate; the stress that is applied to the optical semiconductor structure is relaxed; peeling does not occur at the bonding interface between the structure body layer 13 and the optical semiconductor structure 16; and even in the case of environment temperature changes and/or temperature cycles, the characteristics of the device can be stably maintained; and high reliability can be ensured.

The optical semiconductor structure 16 that includes a first cladding layer 161 of a first conductivity type also serving as a contact layer, a first light confinement layer 162 of the first conductivity type, an active layer 163, a second light confinement layer 164 of a second conductivity type, and a second cladding layer 165 of the second conductivity type are provided on the heterosemiconductor layer 15 including the front surface of the first structure body layer 13.

A second light-reflecting structure is provided on the optical semiconductor structure 16. In the embodiment, the second light-reflecting structure includes a semiconductor multilayer reflective film (distributed Bragg reflector: DBR) 17.

The semiconductor multilayer reflective film 17 has a structure in which semiconductor layers 171 and 172 having mutually-different refractive indexes are stacked alternately. Such a DBR 17 can include an alternatingly-stacked body of AlGaInAs and InP. Also, an alternatingly-stacked body of AlGaAsSb and AlAsSb may be used. It is favorable for the first cladding layer 161 and the second cladding layer 165 each to be formed of n-type or p-type InP.

The optical semiconductor structure 16 has a current confinement structure. The current confinement structure defines an aperture or a light-emitting region including the active layer 163, and confines the current passing through the interior of the semiconductor laser to reduce ineffective current diffusing in the semiconductor laser interior.

In the embodiment, a current confinement layer 18 is provided inside the optical semiconductor structure 16. For example, the current confinement layer 18 can be formed by proton injection. In other words, the active layer 163 is surrounded with a semiconductor layer including implanted ions.

In the structure recited above, the current confinement layer 18 and a portion of the first cladding layer 161 can be mesa-patterned to obtain a truncated circular conical configuration or a truncated pyramid configuration as shown in FIG. 1.

The semiconductor light-emitting device 10 further includes a pair of electrodes for applying a current to the optical semiconductor structure 16. An insulating layer 19 is formed to cover the periphery of the current confinement layer and the front surface of the first cladding layer 161 excluding a portion of the front surface of the current confinement layer 18 and the front surface of the uppermost layer 172 of the DBR 17. One electrode 201 of the pair of electrodes recited above is connected to the first cladding layer 161 through the insulating layer 19. The electrode 201 may have a ring configuration.

The other electrode 202 is formed to cover the periphery of the current confinement layer 18, a portion of the front surface of the current confinement layer 18 exposed from the insulating layer 19, and the front surface of the uppermost layer 172 of the DBR 17. In other words, the uppermost layer 172 of the DBR 17 functions as a contact layer for the electrode 202. The electrode 202 can be formed of a metal layer. It goes without saying that the metal layer also serves as the other electrode of the pair of electrodes; but the metal layer also increases the reflectance of the second light-reflecting structure 17 including the DBR. By further providing the metal layer 202, the reflectance of the second light-reflecting structure including the DBR 17 can achieve a reflectance of substantially 99.9%. The metal layer 202 can be selected according to the light emitted from the laser. For example, in the case where the emitted light is visible light, the metal layer 202 can be formed of silver; and in the case where the emitted light is near-infrared light, the metal layer 202 can be formed of gold, aluminum, or copper.

Thus, by providing the metal layer 202 as the uppermost layer of the second light-reflecting structure, the light that is generated by the active layer 163 can be extracted from the substrate 11 side even more reliably.

The light that is generated by the active layer 163 is amplified while oscillating between the two light-reflecting structures recited above and is emitted via the first light-reflecting structure 13 in a direction perpendicular to the surface of the substrate 11. In such a case, to allow the light generated by the active layer 163 to pass through the substrate 11, the semiconductor material included in the substrate 11 has a bandgap energy larger than the bandgap energy of the semiconductor material included in the active layer. For example, the substrate 11 can be formed of silicon in the case where the active layer is formed of a Group III-V semiconductor or a Group II-IV compound semiconductor.

In the semiconductor light-emitting device 10 shown in FIG. 1, the active layer 163 is narrower than the first light-reflecting structure 13, that is, the surface area of the active layer 163 is less than the surface area of the first light-reflecting layer 13. Also, the DBR 17 can have a lens effect. Specifically, the DBR 17 may have a Fresnel lens structure.

The Group III-V semiconductor of the method for manufacturing the semiconductor light-emitting device according to the embodiment is not limited and can be selected according to the appropriate application.

A method for manufacturing the semiconductor light-emitting device according to the first embodiment will now be described using FIG. 2 and FIG. 3. For convenience of description, for example, the notation of a first silicon oxide layer and a second silicon oxide layer is used. Likewise, the notation of the first silicon oxide layer and the second silicon oxide layer is used similarly in the second to seventh embodiments described below; but "first" and "second" are used for convenience; and the use of the same names does not imply the same role when manufacturing, etc.

This method is a method for manufacturing the semiconductor laser device shown in FIG. 1 in which the substrate 11 is a heterosubstrate formed of a different type of semiconductor material from the semiconductor of the optical semiconductor structure 16.

Figure 2:
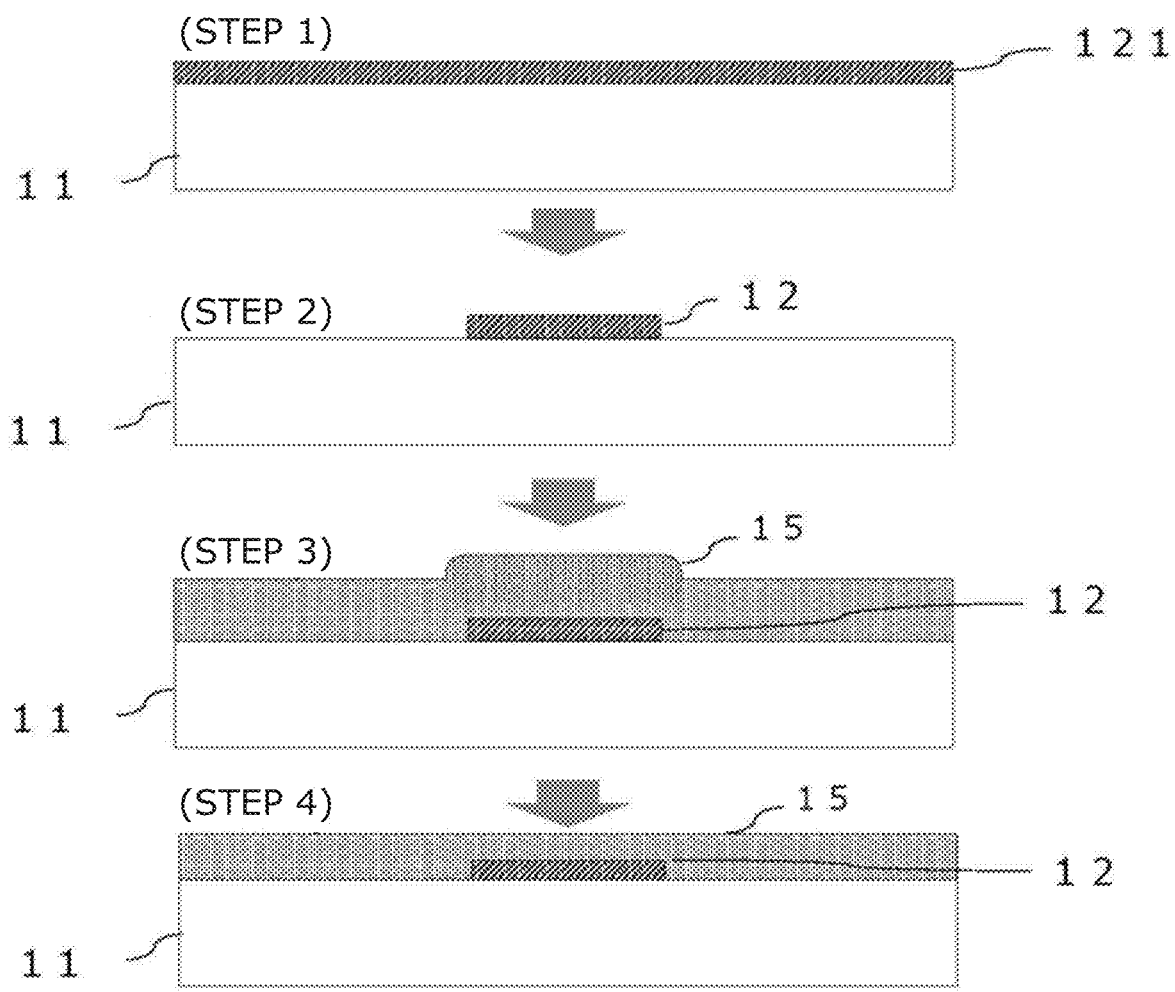
FIG. 2 is a drawing for describing steps 1 to 4 of a method for manufacturing a first semiconductor structure of the method for manufacturing the semiconductor light-emitting device according to the first embodiment.

First, as shown in FIG. 2, a first silicon oxide layer 121 is formed on the heterosubstrate 11 which is a silicon substrate or the like (step 1). The first silicon oxide layer is used as the foundation of a periodic structure described below. The first silicon oxide layer becomes a dielectric layer after being patterned in step 2, and therefore may be called a precursor layer as well. The silicon oxide layer that is used to form the precursor layer is not limited to a silicon oxide layer; for example, an ITO layer, an InTiO$_x$ layer, an InWO$_x$ layer, etc., also can be used.

Then, the precursor layer 121 is patterned (step 2). In the patterning of the precursor layer 121, the dielectric layer 12 portion is formed on the substrate by dry etching or wet etching using a photoresist or the like as a mask. A silicon layer 15 which is a high refractive index layer is formed on the patterned dielectric layer 12 (step 3). The silicon layer 15 exists on both the patterned dielectric layer 12 and the silicon substrate 11 exposed by the etching. In such a case, poly-Si (polysilicon), amorphous silicon, etc., can be used as the silicon layer 15. The silicon layer 15 has the same meaning as the buried layer 15.

Subsequently, the silicon layer 15 that is formed on the dielectric layer 12 is planarized (step 4). At this time, the silicon layer 15 is planarized so that the dielectric layer 12 is not exposed. Chemical mechanical polishing (CMP) can be used to planarize. By planarizing without cutting away the silicon layer 15 until the dielectric layer 12 is exposed, the portion that remains on the dielectric layer can be utilized as a high contrast grating (HCG) structure described below.

Figure 3:
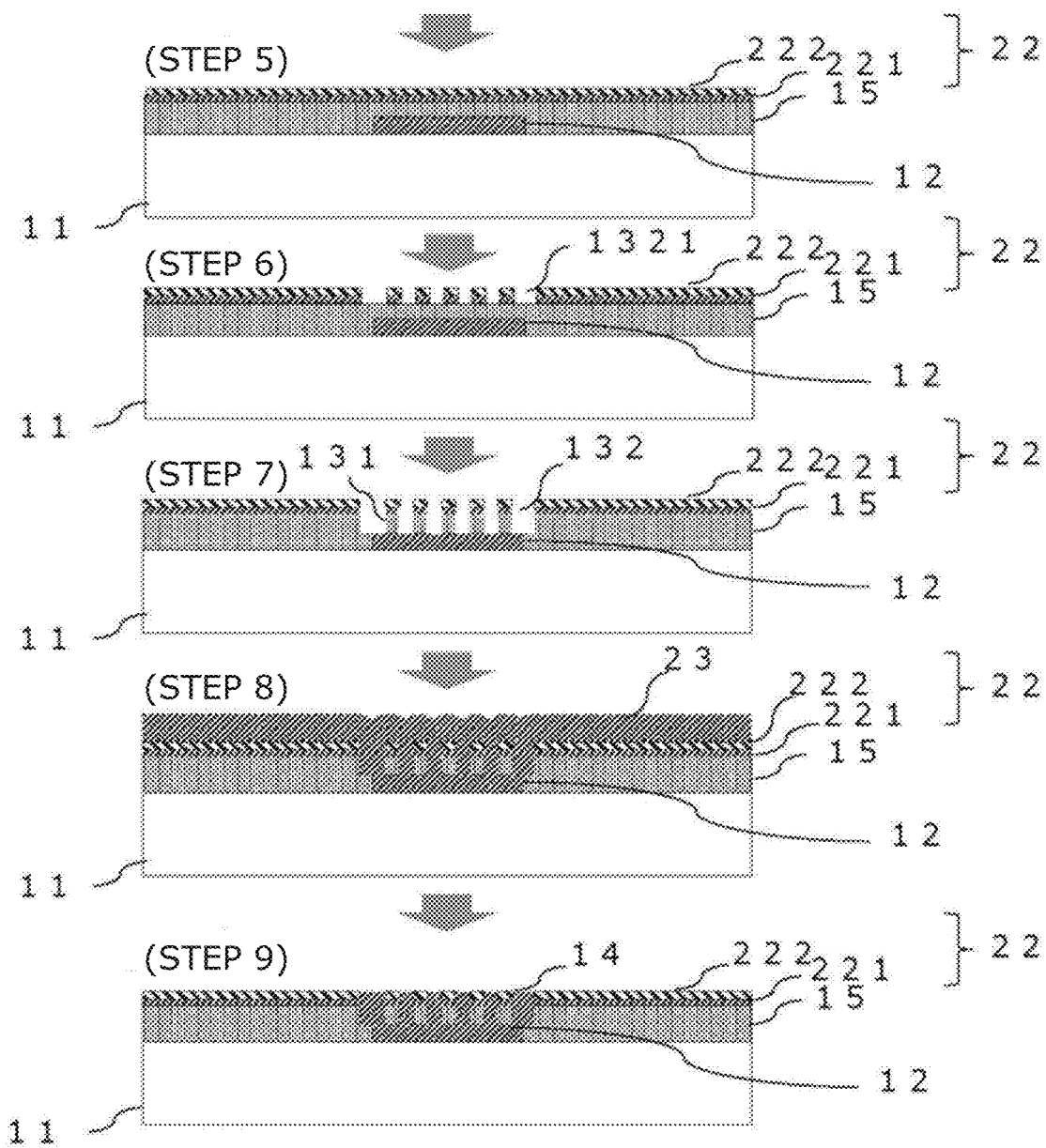
FIG. 3 is a drawing for describing steps 5 to 9 of the method for manufacturing the first semiconductor structure of the method for manufacturing the semiconductor light-emitting device according to the first embodiment.

As shown in FIG. 3, a second silicon oxide layer 221 and a silicon nitride layer 222 are formed on the planarized silicon layer 15 (step 5). At this time, the second silicon oxide layer 221 is provided on the silicon layer 15; and the silicon nitride layer 222 is provided on the silicon oxide layer. The second silicon oxide layer 221 and the silicon nitride layer 222 are called a mask layer because the second silicon oxide layer 221 and the silicon nitride layer 222 are used as a mask for forming the periodic structure in step 7 described below. The formation of the periodic structure also is called HCG patterning.

Then, HCG patterning of the mask layer 22 that is formed is performed to form a periodic structure, i.e., openings 1321 separated at a constant period, in the mask layer 22 (step 6). In the patterning of the mask layer 22, the resist pattern of the periodic structure is formed by exposing a photoresist using photolithography, etc., on the mask layer 22. Subsequently, the resist is used as a mask; and the openings 1321 that are separated at the constant period are formed in the mask layer 22 under the resist. First, the photoresist layer is formed on the mask layer; the resist pattern of the periodic structure is formed by exposing the photoresist using photolithography, etc.; and a first periodic structure is formed by performing dry etching of the mask layer conforming to the photoresist layer.

Subsequently, further etching of the silicon layer 15 is performed (step 7). At this time, openings that are separated at a constant period are formed in the silicon layer 15 by using the mask layer formed in step 6 as a mask. A second periodic structure is formed thereby. The positions and the configurations match between the openings 1321 formed in step 6 and the openings formed in step 7. Therefore, the openings 1321 that are formed in step 6 and the openings that are formed in step 7 together are called the openings 132. That is, the openings generally refer to the first periodic structure formed by the HCG patterning and have the refractive index changing periodically in the in-plane direction. Also, the silicon layer 15 that is not etched exists as the main material 131. The main material 131 is not illustrated in FIG. 3 and subsequent drawings to avoid complexity of the drawings.

Subsequently, a third silicon oxide layer 23 is formed on the silicon nitride layer 222 (step 8). At this time, the third silicon oxide layer 23 is formed to fill the openings 132 so that gaps do not remain in the openings 132. The third silicon oxide layer 23 is a low refractive index layer and becomes the dielectric 14 in the semiconductor light-emitting device. Therefore, the third silicon oxide layer 23 also is called the pre-dielectric 23. ITO, InTiO$_x$, InWO$_x$, etc., can be used as the third silicon oxide layer as well.

The third silicon oxide layer 23 is planarized by CMP (step 9). By planarizing, the third silicon oxide layer 23 exists without leaving gaps in the openings 132; and the front surface of the first structure body layer 13 and the front surface of the silicon nitride layer 222 which is the mask layer 22 are in substantially the same plane. That is, the front surface of the first structure body layer 13 and the mask layer 22 each are flat and are substantially coplanar. The semiconductor structure that includes the first structure body layer 13 is called the first semiconductor structure.

Thus, by pre-forming the first light-reflecting structure, the dishing of the periphery can be suppressed compared to the case where the periphery of the first reflective structure is removed by etching after forming the first reflective structure and a silicon layer is formed and planarized using CMP; and the front surface of the first structure body layer 13 and the front surface of the buried layer 15 can be formed to be coplanar over the entire wafer surface. Therefore, the optical semiconductor structure that is formed on the first semiconductor structure can be coplanar and can be in close contact over the entire surface. Thereby, the peeling at the bonding interface between the semiconductor structure body layer 13 and the optical semiconductor structure is suppressed; and even in the case of environment temperature changes and/or temperature cycles, the characteristics of the device can be maintained stably; high reliability can be ensured; and the yield and/or the productivity when manufacturing the semiconductor device can be increased.

Figure 4A:
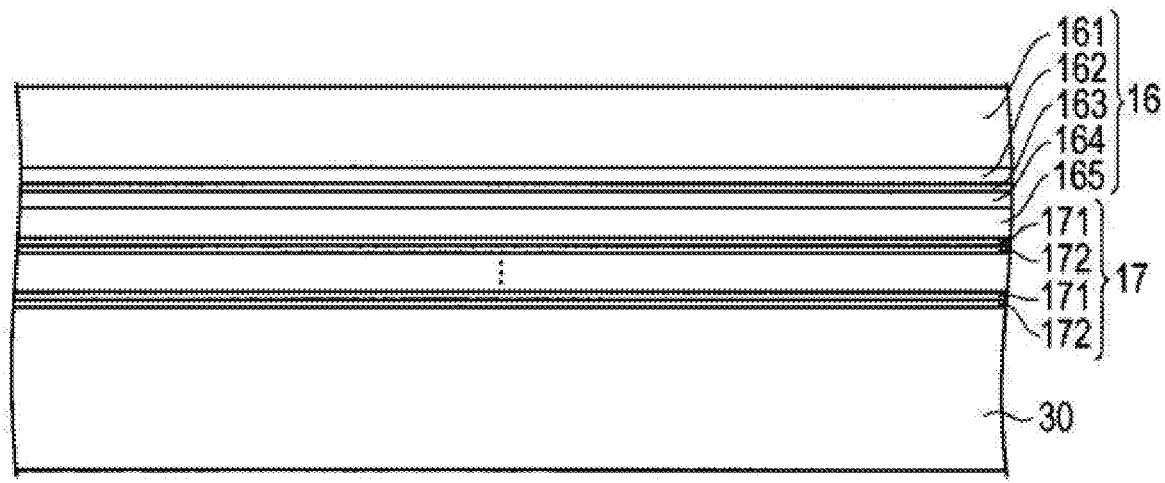
FIGS. 4A and 4B are drawings for describing a method for manufacturing a second semiconductor structure of the method for manufacturing the semiconductor light-emitting device according to the first embodiment.

On the other hand, as shown in FIG. 4A, the semiconductor multilayer reflective film (DBR) 17 is formed by alternately stacking the semiconductor layers 172 and 171 having mutually-different refractive indexes on a homosubstrate (e.g., a Group III-V compound semiconductor substrate) 30. As described above, such a DBR 17 can include an alternatingly-stacked body of AlGaInAs and InP. In such a case, it is favorable for the first cladding layer 161 and the second cladding layer 165 described below to be formed of n-type or p-type InP. The optical semiconductor structure 16 is formed by stacking the second cladding layer 165, the second light confinement layer 164, the active layer 163, the first light confinement layer 162, and the first cladding layer 161 (also serving as the contact layer) on the DBR 17. For example, the optical semiconductor structure 16 is formed of a Group III-V compound semiconductor. As a result, a semiconductor structure that includes the optical semiconductor structure 16 including the active layer is obtained; and this is called the second semiconductor structure hereinbelow.

Figure 4B:
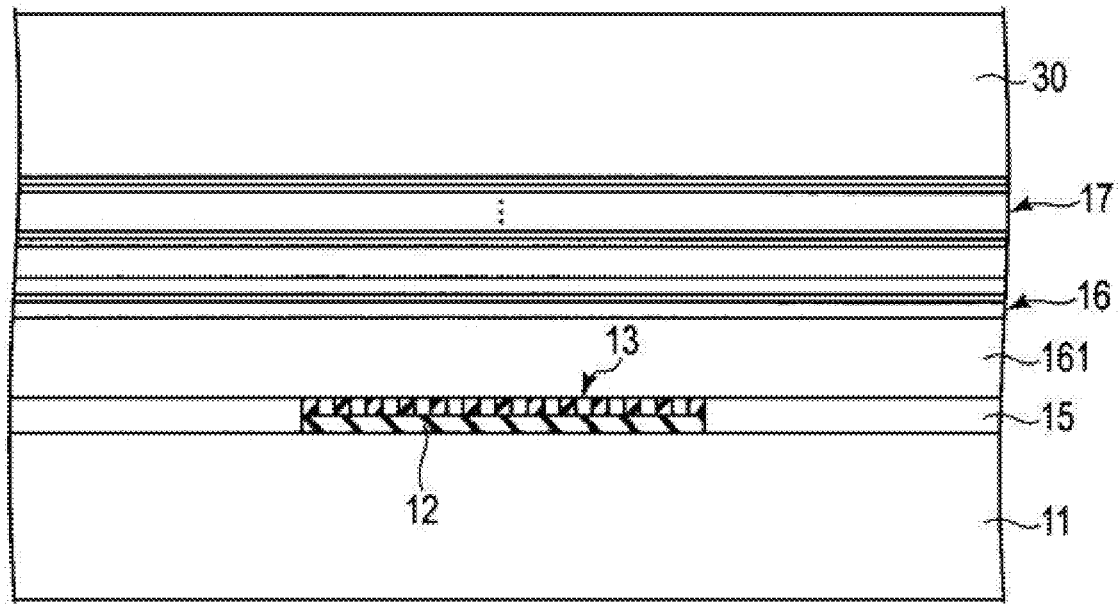

Then, the first semiconductor structure recited above and the second semiconductor structure recited above are bonded so that the front surface of the first semiconductor structure including the first structure body layer 13 and the first cladding layer 161 of the second semiconductor structure oppose each other (FIG. 4B). The structure thus obtained is called a third semiconductor structure.

Figure 5A:
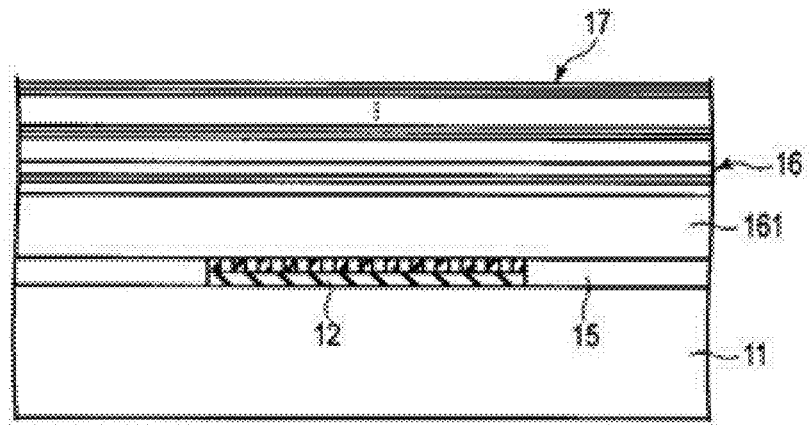
FIGS. 5A to 5C are drawings for describing the method for manufacturing the second semiconductor structure of the method for manufacturing the semiconductor light-emitting device according to the first embodiment.

Then, the homosubstrate 30 is removed from the third semiconductor structure by mechanical polishing, wet etching, or a combination of the two. The front surface of the DBR 17 is exposed (FIG. 5A).

Figure 5B:
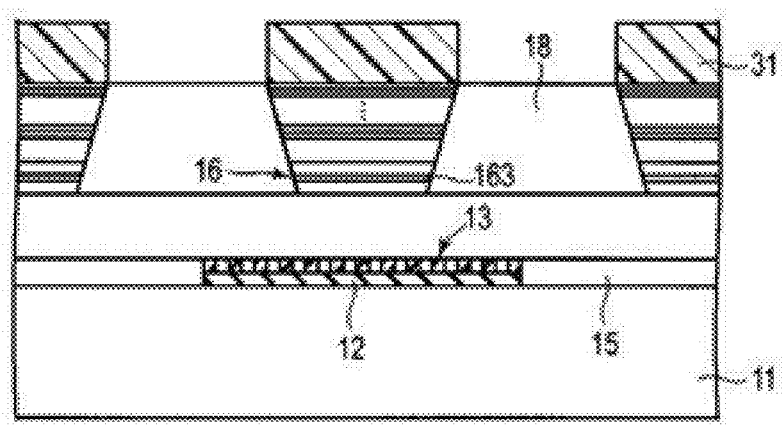

Then, a mask 31 is formed on the front surface other than the current confinement layer formation portion; and ion implantation into the current confinement layer formation portion is performed. For example, the ion implantation is proton injection. The current confinement layer 18 is formed inside the optical semiconductor structure 16 including the DBR 17 by ion implantation (FIG. 5B). The current confinement layer 18 may have a ring configuration.

Figure 5C:
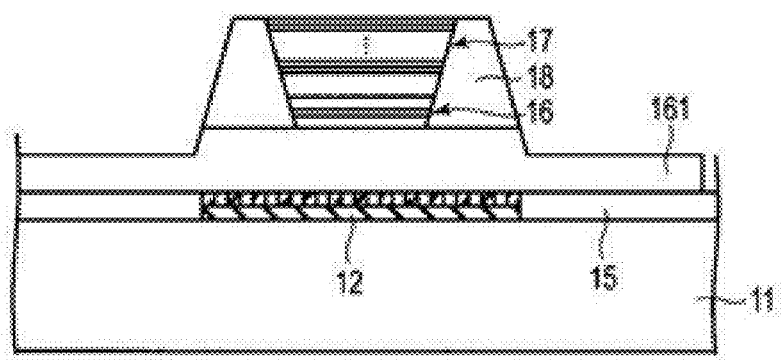

Then, after removing the mask 31, the current confinement layer 18 is mesa-patterned into a truncated circular conical configuration (FIG. 5C).

Thereafter, the semiconductor light-emitting device that has the structure shown in FIG. 1 is manufactured by forming the insulating layer 19 and the electrodes 201 and 202. It goes without saying that the first light-reflecting structure 13 and the optical semiconductor structure 16 and the second light-reflecting structure 17 defined by the current confinement layer 18 are included in the optical resonator.

According to the manufacturing method described in reference to FIG. 2 to FIG. 5C, even though the completed semiconductor light-emitting device includes the optical semiconductor structure 16 formed of the Group III-V compound semiconductor on the heterosubstrate (e.g., the silicon substrate) 11, the optical semiconductor structure 16 is formed on the homosubstrate 30 and therefore achieves lattice matching; accordingly, caution for lattice mismatch such as that when growing the Group III-V compound semiconductor layer on a heterosubstrate is unnecessary. In other words, according to this technique, it is unnecessary to perform heteroepitaxial growth.

Modifications

Modifications of the method for manufacturing the semiconductor light-emitting device according to the embodiment will now be described. Steps 1 to 4 are common between the modifications and the method for manufacturing the semiconductor light-emitting device according to the embodiment described above; and a description of these portions is therefore omitted. The portions that are different from the manufacturing method described above will now be described.

First Modification

Figure 6:
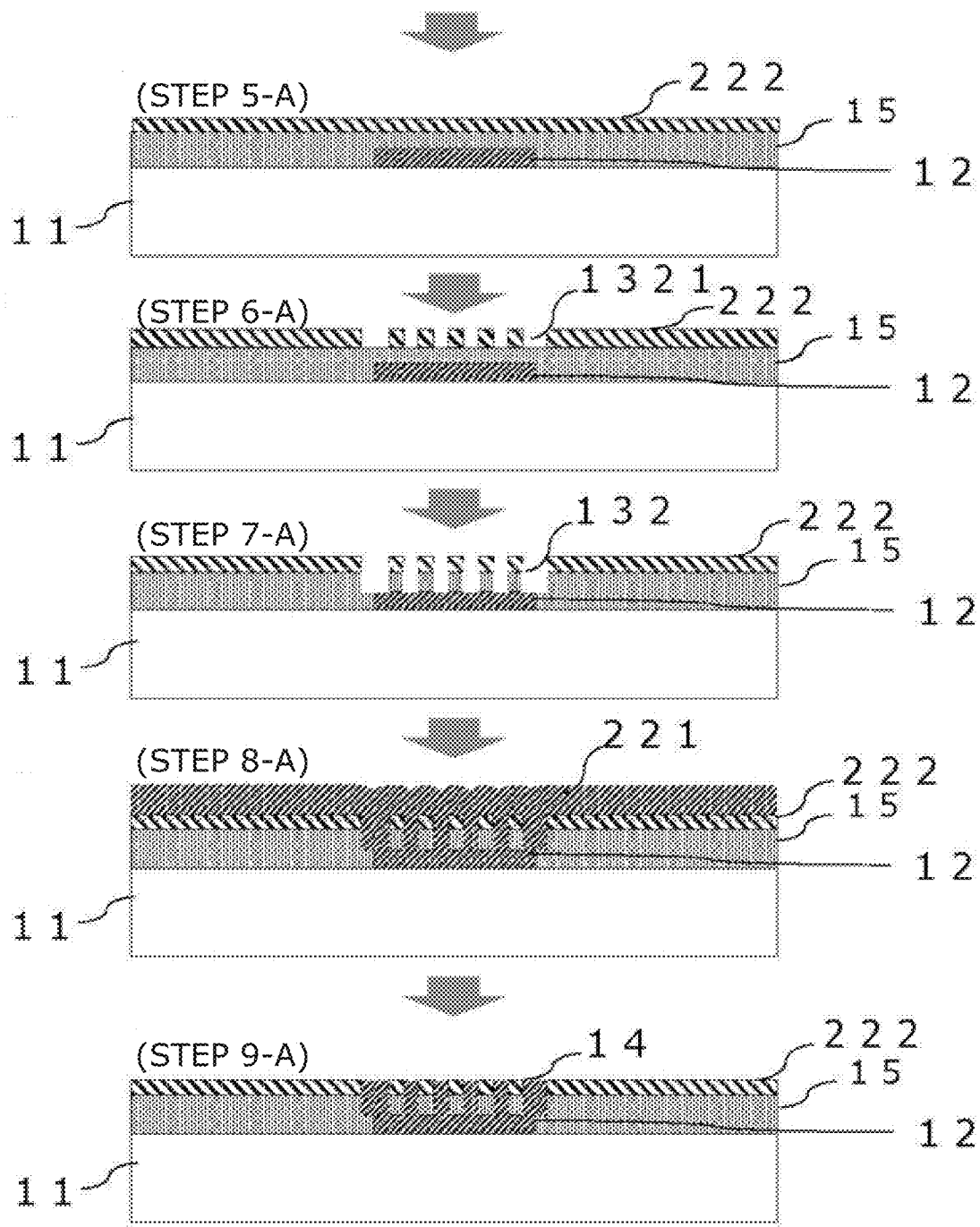
FIG. 6 is a drawing for describing a first modification of the method for manufacturing the first semiconductor structure of the method for manufacturing the semiconductor light-emitting device according to the first embodiment.

As shown in FIG. 6, after forming the silicon layer 15 as the high refractive index layer, the silicon nitride layer 222 is formed as a mask layer on the silicon layer 15 (step 5-A). Thus, by forming the silicon nitride layer 222 on the silicon layer 15, the excessive removal of the silicon layer 15 can be prevented when forming the periodic structure in step 6-A described below.

Then, a resist pattern of a periodic structure is formed on the silicon nitride layer 222 by exposing a photoresist using photolithography, etc. Subsequently, the openings 1321 that are separated at a constant period are formed in the silicon nitride layer 222 under the resist by using the resist as a mask (step 6-A).

Other than the second silicon oxide layer 221 not existing, the subsequent processes, i.e., steps 7 to 9, are the same as those of the method for manufacturing the semiconductor light-emitting device according to the first embodiment described above.

By performing the method for manufacturing the first modification using only the silicon nitride layer 222 as the mask layer, the heat dissipation can be improved compared to the case where the silicon oxide layer exists.

Second Modification

A modification of the method for manufacturing the semiconductor light-emitting device according to the embodiment will now be described. Steps 1 to 2 are common between the modification and the method for manufacturing the semiconductor light-emitting device according to the embodiment described above; and a description of these portions is therefore omitted. The portions that are different from those of the method for manufacturing the semiconductor light-emitting device according to the embodiment will now be described.

Figure 7:
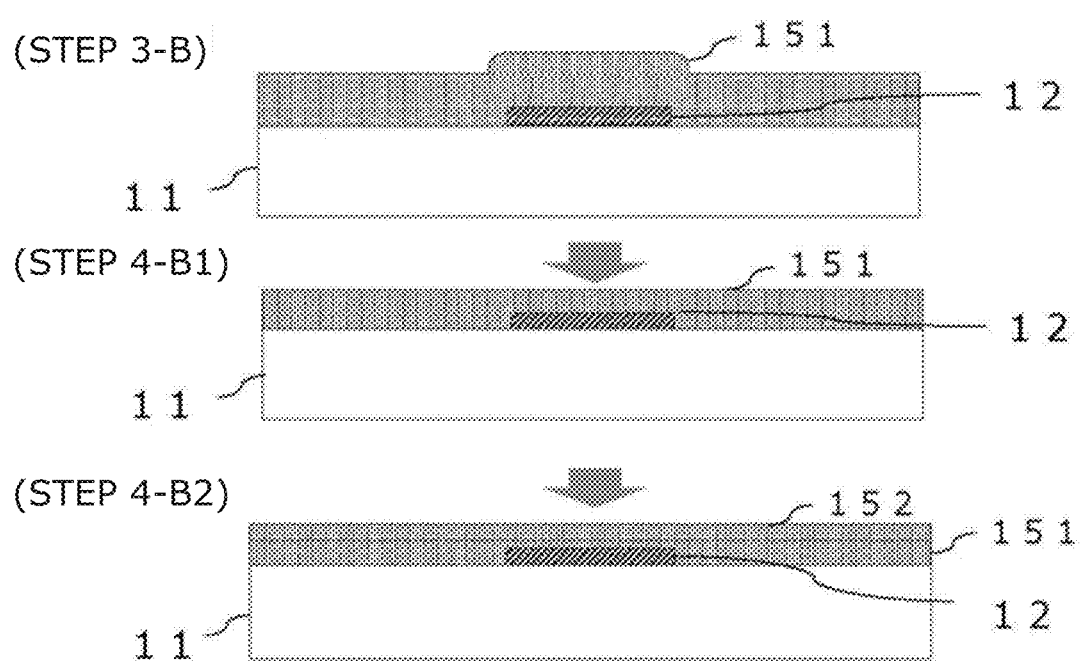
FIG. 7 is a drawing for describing steps 3 to 4 of a second modification of the method for manufacturing the first semiconductor structure of the method for manufacturing the semiconductor light-emitting device according to the first embodiment.

As shown in FIG. 7, a silicon layer 151 is formed as a high refractive index layer on the dielectric layer 12 after step 2 (step 3-B). The silicon layer 151 exists on both the patterned dielectric layer 12 and the silicon substrate 11. Subsequently, the silicon layer 151 is planarized (step 4-B1). In the planarization, the silicon layer 151 is cut away until substantially coplanar with the surface of the dielectric layer 12 on the side opposite to the surface contacting the heterosubstrate. At this time, the silicon layer 151 that exists on the dielectric layer 12 is formed to be thinner than the thickness of the silicon layer 15 existing on the dielectric layer 12 of the method for manufacturing the semiconductor light-emitting device according to the first embodiment described above and thinner than the thickness of the silicon layer 15 existing on the dielectric layer 12 of the first modification of the method for manufacturing the semiconductor light-emitting device according to the first embodiment.

Then, a silicon layer 152 is formed on the planarized silicon layer 151 (step 4-B2). At this time, the silicon layer 152 is formed so that the total of the thickness of the silicon layer 152 and the thickness of the silicon layer 151 planarized in step 4-B1 is the same as the thickness of the silicon layer 15 for the first modification and the method for manufacturing the semiconductor light-emitting device according to the first embodiment. Thus, it is possible to control the thickness of the silicon layer 15 precisely by forming the silicon layer 15 as the high refractive index layer in two stages.

Figure 8:
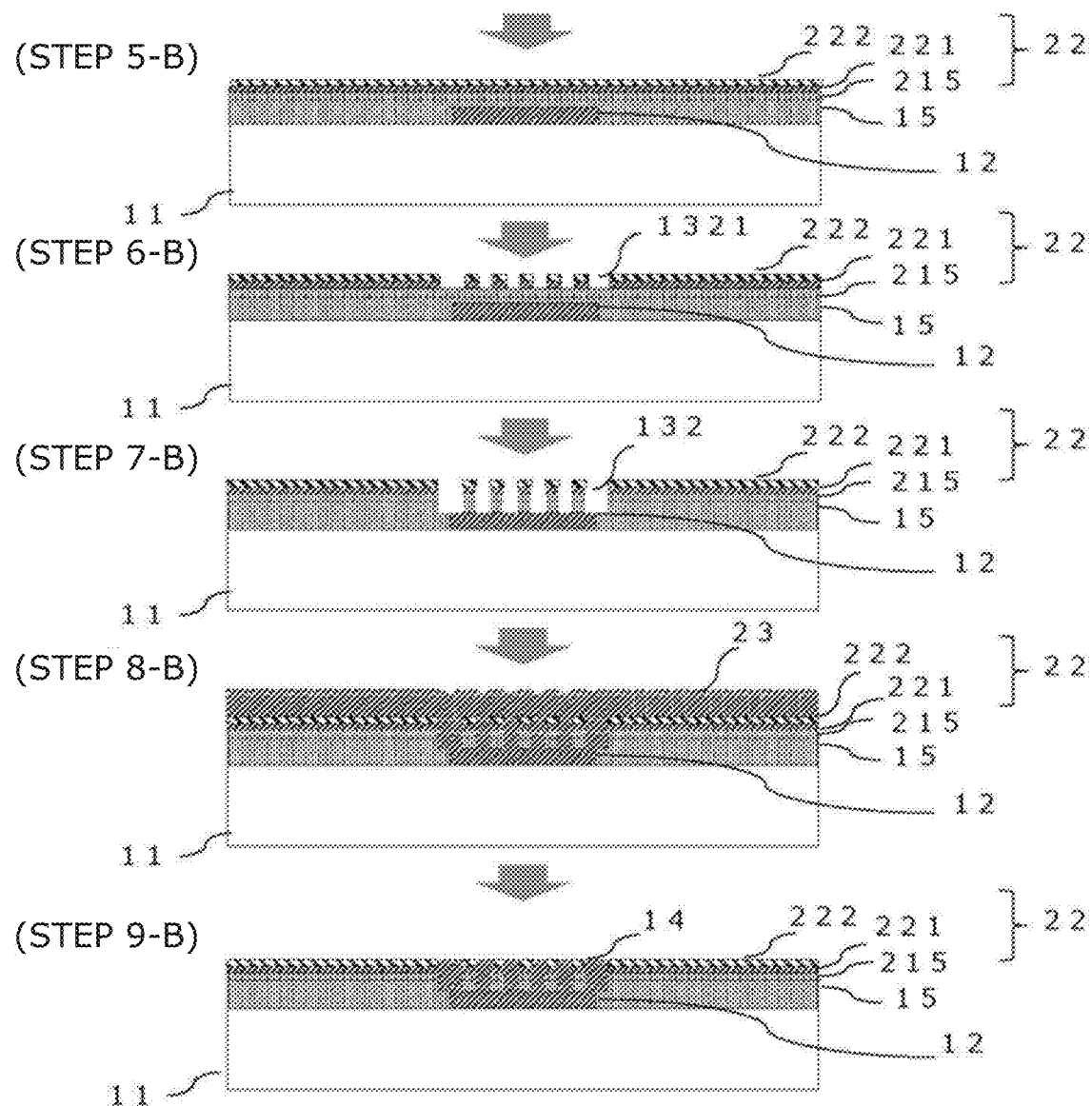
FIG. 8 is a drawing for describing steps 5 to 9 of the second modification of the method for manufacturing the first semiconductor structure of the method for manufacturing the semiconductor light-emitting device according to the first embodiment.

The subsequent processes of step 5-B to 9-B are shown in FIG. 8, and are the same as steps 5 to 9 of the method for manufacturing the semiconductor light-emitting device according to the first embodiment described above.

Third Modification

A third modification is the same as the second modification up to step 4-B2.

Figure 9:
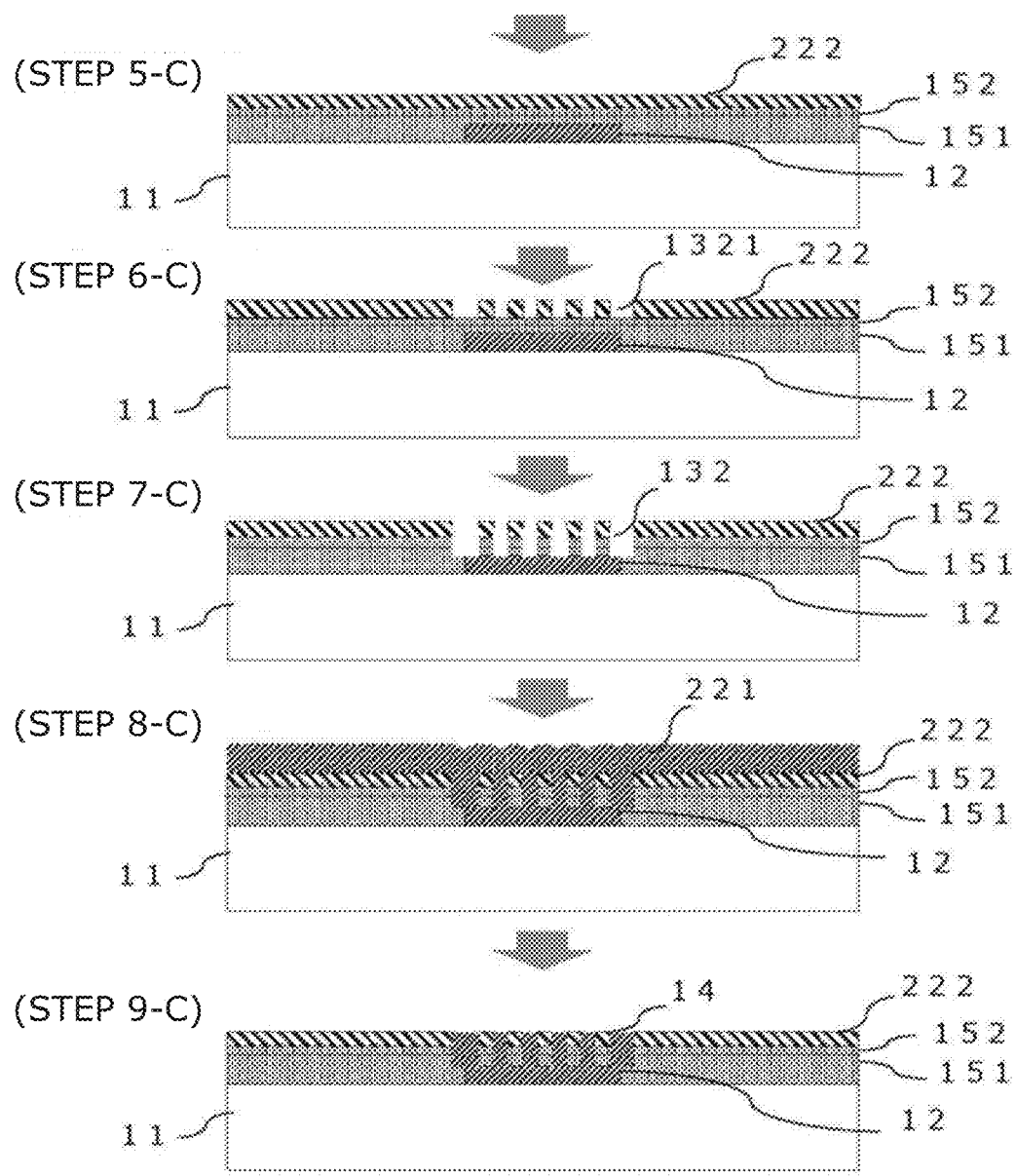
FIG. 9 is a drawing for describing steps 5 to 9 of a third modification of the method for manufacturing the first semiconductor structure of the method for manufacturing the semiconductor light-emitting device according to the first embodiment.

As shown in FIG. 9, the silicon nitride layer 222 is formed on the silicon layer 152 formed in step 4-B2 (step 5-C).

The subsequent processes of step 6-C to 9-C are the same as step 6 to step 9 of the first modification of the method for manufacturing the semiconductor light-emitting device according to the first embodiment described above.

As in the method for manufacturing the third modification, by using only silicon nitride as the mask layer, compared to the case where the silicon oxide layer exists, the heat dissipation can be improved; and it is possible to control the film thickness of the silicon layer precisely.

In the method for manufacturing the semiconductor light-emitting device according to the embodiment, the structure that includes the optical semiconductor structure 16, the homosubstrate 30, and the DBR 17, i.e., the second semiconductor structure, can be selected appropriately. The method for manufacturing the semiconductor light-emitting device according to the embodiment can be modified to match the structure of the selected Group III-V compound semiconductor. Although four examples are described herein, this is not limited thereto.

Figure 10A:
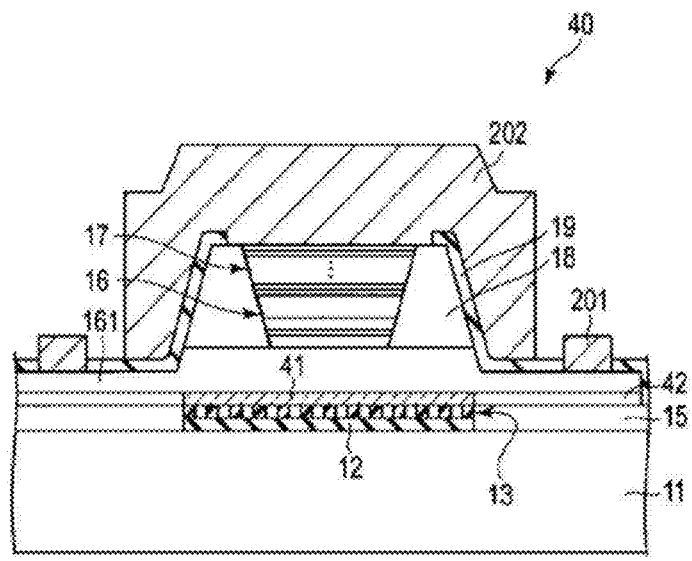
FIGS. 10A to 10C are schematic cross-sectional views of first modifications of the semiconductor light-emitting device according to the first embodiment.

FIG. 10A is a semiconductor light-emitting device manufactured by the method for manufacturing the semiconductor light-emitting device according to the first embodiment. The semiconductor light-emitting device 40 shown in FIG. 10A includes a transparent electrode layer 41 on the first structure body layer 13, and a metal layer 42 provided to surround the transparent electrode layer 41; otherwise, the semiconductor light-emitting device 40 has the same structure as the semiconductor light-emitting device 10 shown in FIG. 1. The transparent electrode layer 41 can be formed of indium titanium oxide (InTiO), indium tin oxide (ITO), etc. The metal layer 42 can be formed of tungsten, etc. The transparent electrode layer 41 and the metal layer formed at the periphery of the transparent electrode layer 41 can be a path of the current flowing between the pair of electrodes 201 and 202.

Figure 10B:
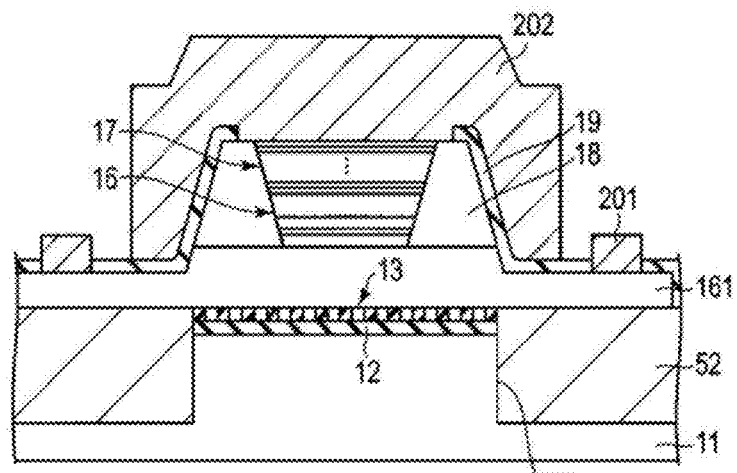

FIG. 10B is a semiconductor light-emitting device manufactured by the method for manufacturing the semiconductor light-emitting device according to the first embodiment. In the semiconductor light-emitting device 50 shown in FIG. 10B, a trench 51 is provided to surround the region inside the substrate 11 corresponding to the region of the first structure body layer 13; and a metal 52 having heat dissipation is buried inside the trench 51; otherwise, the semiconductor light-emitting device 50 has the same structure as the semiconductor light-emitting device 10 shown in FIG. 1. For example, copper can be used as the metal 52. The heat-dissipating metal 52 buried inside the substrate 11 improves the heat dissipation of the semiconductor light-emitting device 50. Also, the buried metal 52 can be a path of the current flowing between the pair of electrodes 201 and 202. The front surface of the buried metal 52 is coplanar with the front surface of the first structure body layer 13.

The method for manufacturing the semiconductor light-emitting device 50 including such a buried metal 52 will now be described. First, the first structure body layer 13 is formed on the substrate 11 as described in reference to FIG. 2 and FIG. 3; subsequently, the trench 51 for burying the metal is provided inside the substrate 11 by etching.

Then, the heat-dissipating metal 52 is formed inside the trench 51; and a semiconductor structure that corresponds to the first semiconductor structure is provided by planarizing by CMP to cause the front surface of the metal 52 to be coplanar with the front surface of the first light-reflecting structure 13. After this process, the semiconductor light-emitting device 50 can be manufactured by the technique described in reference to FIG. 4A to FIG. 5C.

Figure 10C:
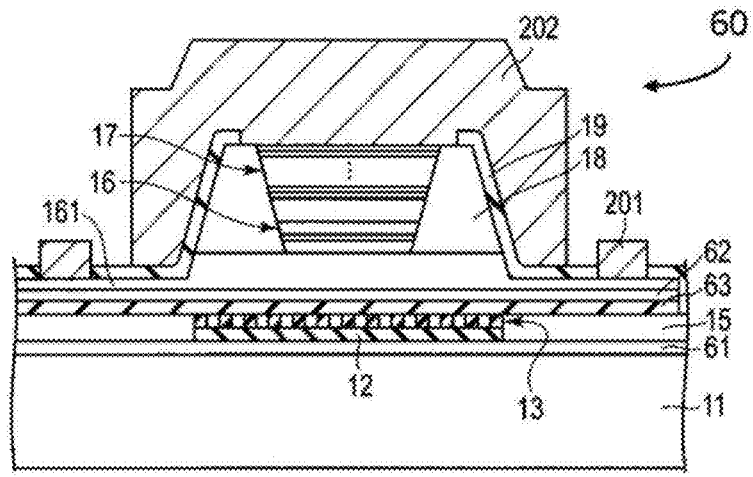

FIG. 10C is a semiconductor light-emitting device manufactured by the method for manufacturing the semiconductor light-emitting device according to the first embodiment. The semiconductor light-emitting device 60 shown in FIG. 10C further includes a first thermally conductive dielectric layer 61 formed between the substrate 11 and the first light-reflecting structure (the first structure body layer) 13 (and the dielectric layer 12 under the first light-reflecting structure (the first structure body layer) 13), and a second thermally conductive dielectric layer 62 formed between the first light-reflecting structure 13 and the optical semiconductor structure 16; otherwise, the semiconductor light-emitting device 60 has the same structure as the semiconductor light-emitting device 10 shown in FIG. 1. Aluminum nitride can be used as the thermally conductive dielectric.

In the semiconductor light-emitting device 60 shown in FIG. 10C, a dielectric layer (e.g., a silicon oxide layer) 63 is interposed between the first structure body layer 13 (and the buried layer 15) and the second thermally conductive dielectric layer 62; and the dielectric layer 63 is for bonding the semiconductor structure corresponding to the first semiconductor structure and the semiconductor structure corresponding to the second semiconductor structure. In other words, when manufacturing the semiconductor light-emitting device 60 shown in FIG. 7, the uppermost layer of the semiconductor structure corresponding to the first semiconductor structure is the dielectric layer formed on the first structure body layer 13 (and the buried layer 15); and the uppermost layer of the semiconductor structure corresponding to the second semiconductor structure is the dielectric layer 12 formed on the second thermally conductive dielectric layer 62. The uppermost layers (the dielectric layers 12) of the two semiconductor structures are bonded to each other.

Figure 11:
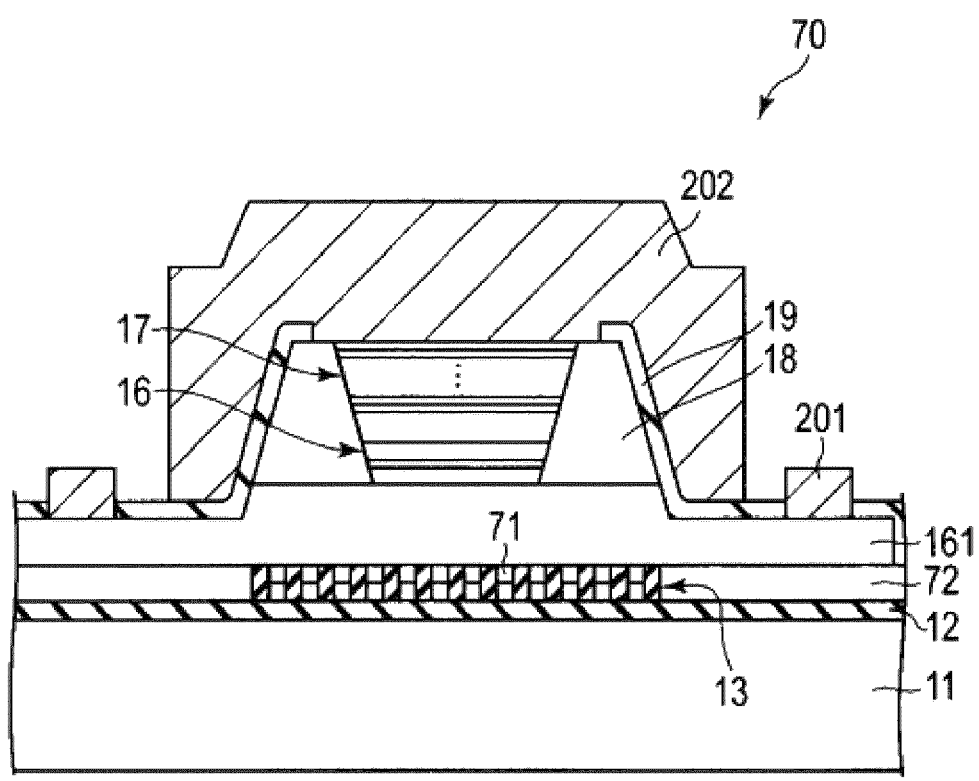
FIG. 11 is a schematic cross-sectional view of a second modification of the semiconductor light-emitting device according to the first embodiment.

FIG. 11 is a semiconductor light-emitting device manufactured by the method for manufacturing the semiconductor light-emitting device according to the first embodiment. In the semiconductor light-emitting device 70 shown in FIG. 11, a wire grid electrode 71 is provided on the first structure body layer 13; a silicide layer 72 of the metal used to form the wire grid electrode 71 is provided to surround the wire grid electrode 71 and the first structure body layer 13 under the wire grid electrode 71; otherwise, the semiconductor light-emitting device 70 has substantially the same structure as the semiconductor light-emitting device shown in FIG. 1. For example, the wire grid electrode 71 can be formed of tungsten. In the semiconductor light-emitting device 70, the first reflective layer includes the metal grid electrode 71 (in addition to the first structure body layer 13). The front surface of the metal grid electrode 71 is coplanar with the front surface of the metal silicide layer (the buried layer) 72.

In the method for manufacturing the semiconductor light-emitting device 70 shown in FIG. 11, first, the steps up to step 8 of FIG. 3 are performed. Subsequently, the third silicon oxide layer 23 is planarized by CMP; patterning for the wire grid electrode is performed in the third silicon oxide layer 23; and a recess 141 for burying the wire grid electrode formation metal inside a dielectric layer 1214 is provided by etching via the mask.

Then, the third silicon oxide layer front surface is partially exposed by removing, by progressively etching, the portion of an amorphous silicon layer 131 and the portion of the dielectric layer 1214 on the portion of the amorphous silicon layer 131 other than the portion corresponding to the first structure body layer 13.

Thereafter a grid electrode metal 82 is formed on the dielectric layer 1214 remaining on the first structure body layer 13, inside the recess 141 formed inside the dielectric layer 1214, and on the exposed third silicon oxide layer; and after planarizing these components to the front surface of the remaining dielectric layer 1214 by CMP, an amorphous silicon layer 83 is formed on the residual dielectric layer 1214 having the recess filled with the metal 82 and on the metal layer 82 on the third silicon oxide layer.

Then, the metal silicide layer 72 is formed by performing heat treatment to silicide the metal 82 by causing the metal 82 and the amorphous silicon layer 83 to react. Subsequently, the silicon not contributing to the siliciding is removed.

Thus, after making the semiconductor structure corresponding to the first semiconductor structure recited above, the semiconductor light-emitting device 70 can be manufactured by the technique described in reference to FIG. 4A to FIG. 5C.

Instead of the DBR, the second light-reflecting structure of the VCSEL device may include a structure body layer in which the refractive index changes periodically in the in-plane direction.

Here, examples of the Group III-V compound semiconductor included in the optical semiconductor structure including the active layer recited above are as follows:
<InP-Based (Part 1)>
  Active layer: Multi-quantum well structure of InGaAsP/InGaAsP having different composition ratios of In
  First and second light confinement layers: InGaAsP or InP
  First and second cladding layers: InGaAsP or InP
  First and second contact layers: InP or InGaAs
  Light-emission wavelength band: 1.2 to 1.7 μm
<InP-Based (Part 2)>
  Active layer: Multi-quantum well structure of InGaAlAs/InGaAlAs having different composition ratios of In
  First and second light confinement layers: InGaAlAs, InGaAsP, or InP
  First and second cladding layers: InGaAlAs or InP
  First and second contact layers: InP or InGaAs
  Light-emission wavelength band: 1.3 μm
<GaAs-Based (Part 1)>
  Light-emitting layer: Multi-quantum well structure of InGaAs/GaAs
  First and second light confinement layers: AlGaAs or GaAs
  First and second cladding layers: AlGaAs or GaAs
  First and second contact layers: GaAs
  Light-emission wavelength band: 0.9 to 1.15 μm
<GaAs-Based (Part 2)>
  Active layer: Multi-quantum well structure of AlGaAs/GaAs
  First and second light confinement layers: AlGaAs or GaAs
  First and second cladding layers: AlGaAs or GaAs
  First and second contact layers: GaAs
  Light-emission wavelength band: 0.62 to 0.87 μm.
<GaAs-Based (Part 3)>
  Active layer: Multi-quantum well structure of AlGaInP/GaAs
  First and second light confinement layers: AlGaInP, AlGaAs, or GaAs
  First and second cladding layers: AlGaInP or GaAs
  First and second contact layers: GaAs
  Light-emission wavelength band: 0.54 to 0.7 μm
<Gan-Based>
  Active layer: Multi-quantum well structure of InGaN/AlGaN
  First and second light confinement layers: AlGaN or GaN
  First and second cladding layers: AlGaN or GaN
  First and second contact layers: GaN or InGaN
  Light-emission wavelength band: 0.3 to 0.6 μm The optical semiconductor structure also can be formed of a ZnSe-based Group II-VI compound semiconductor, e.g., CdZnSSe, etc.

Examples of the metal materials used to form the electrodes are as follows.
<For InP-Based Optical Semiconductor Structure>
  p-electrode: Three-layer structure of Ti/Pt/Au, two-layer structure of Zn/Au, etc.
  p-electrode: Three-layer structure of Ti/Pt/Au, etc.
<For GaAs-Based Optical Semiconductor Structure>
  p-electrode: Three-layer structure of Ti/Pt/Au, etc.
  n-electrode: Three-layer structure of AuGe/Ni/Au, etc.

The thickness of an amorphous silicon layer 931 is, for example, 0.2 μm to 0.5 μm; and the thickness of an amorphous silicon layer 971*a* is, for example, 0.2 μm to 0.5 μm.

For an optical semiconductor structure 95, the thicknesses of first and second contact layers 951 and 957 each are, for example, 0.2 μm to 1.5 μm; the thicknesses of first and second cladding layers 952 and 956 each are, for example, 0.1 μm to 0.5 μm; the thicknesses of first and second light confinement layers 953 and 955 each are, for example, 0.05 μm to 0.2 μm; and the thickness of an active layer 954 is, for example, 0.05 μm to 0.2 μm. The diameter of the aperture defining a current confinement layer 99 is, for example, 5 μm to 20 μm.

However, the method for manufacturing the first reflective structure of the method for manufacturing the semiconductor light-emitting device according to the embodiment also is applicable to the first light-diffusing structure of the semiconductor light-receiving device. Therefore, according to the method for manufacturing the semiconductor light-emitting device according to the first embodiment described in reference to FIG. 2A to FIG. 5C, a semiconductor light-receiving device can be manufactured simultaneously with the semiconductor light-emitting device on the same substrate (a common substrate). An example of such a method for manufacturing the optical semiconductor device in which the semiconductor light-emitting device and the semiconductor light-receiving device are formed on the same substrate is described below.

Figure 12:
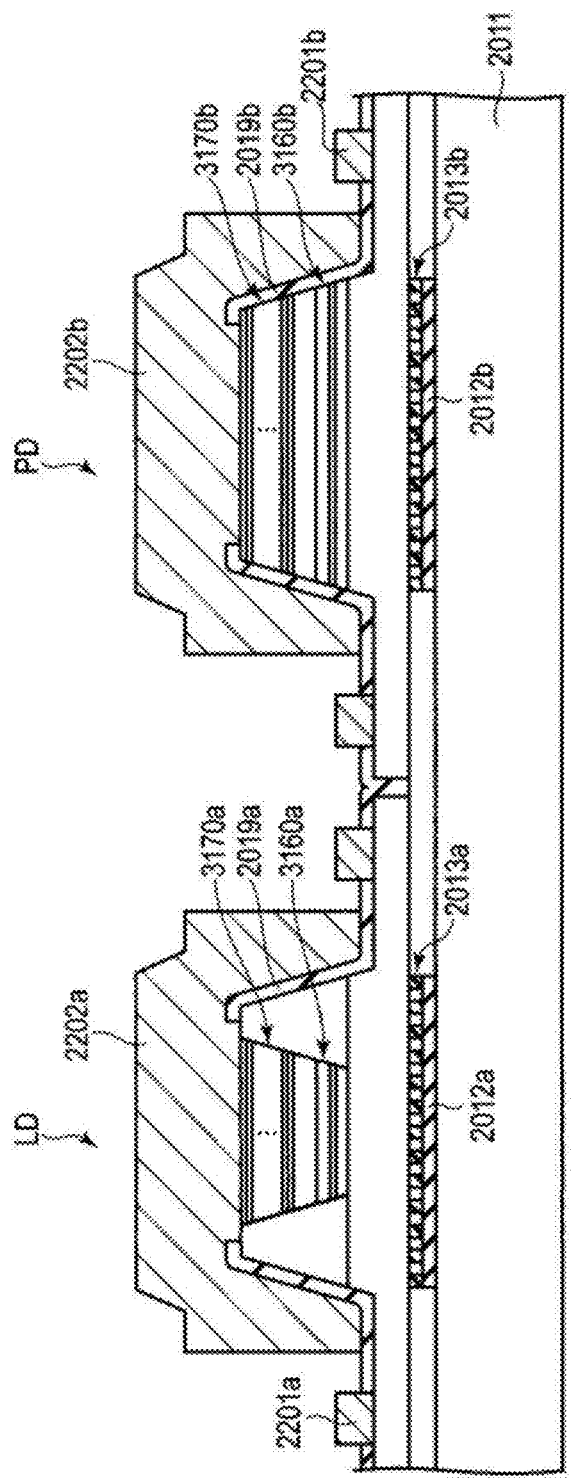
FIG. 12 is a schematic cross-sectional view of a third modification of the semiconductor light-emitting device according to the first embodiment.

Namely, according to the technique described in reference to FIG. 2 and FIG. 3, a first structure body layer 2013a (having a refractive index changing periodically) of the light-emitting device and a lower structure body layer 2013b (having a refractive index changing periodically) of the light-receiving device separated from the light-emitting device are formed on a heterosubstrate (e.g., a silicon substrate) 2011 similar to the substrate 11 shown in FIG. 12. The two structure body layers 2013a and 2013b are formed respectively on dielectric layers 2012a and 2012b; and the stacked body of the dielectric layer 2012a and the structure body layer 2013a and the stacked body of the dielectric layer 2012b and the structure body layer 2013b are surrounded with a buried layer (e.g., an amorphous silicon layer, a silicon oxide layer, and the silicon nitride layer 222) 2015. It goes without saying that in the structure body layers 2013a and 2013b, the high refractive index region made of the buried layer and the low refractive index region made of dielectric layers 2014a and 2014b filled into the openings provided inside the buried layer are two-dimensionally arranged periodically. Light from the light-emitting device is incident on the first structure body 2013b of the light-receiving device. The semiconductor structure thus obtained is called the first semiconductor structure.

Then, according to the technique described in reference to FIG. 4A, a semiconductor multilayer reflective film (a DBR) 3170 is formed on a homosubstrate (e.g., a Group III-V compound semiconductor substrate) 3000 by alternately stacking semiconductor layers 3172 and 3171 having mutually-different refractive indexes. Then, a semiconductor structure (a second semiconductor structure) that includes an optical semiconductor structure 3160 including an active layer is obtained by forming the optical semiconductor structure 3160 by stacking a second cladding layer 3165, a second light confinement layer 3164, an active layer 3163, a first light confinement layer 3162, and a first cladding layer (also serving as a contact layer) 3161 on the DBR 3170. Then, the first semiconductor structure recited above and the second semiconductor structure recited above are bonded so that the front surface including the first structure body layers 2013a and 2013b of the first semiconductor structure and the first cladding layer 3161 of the second semiconductor structure oppose each other. Direct bonding with the buried layer 2015 is possible if the first cladding layer 3161 is formed of InP. The structure thus obtained is called a third semiconductor structure.

Then, at the third semiconductor structure, the front surface of the DBR 3170 (the uppermost layer 3172) is exposed by removing the homosubstrate 3000 by mechanical polishing, wet etching, or a combination of the two. Then, a mask 3001 is formed on the front surface of the optical semiconductor structure 3160 of the light-emitting device other than the current confinement layer formation portion; and ion implantation into the current confinement layer formation portion is performed. The ion implantation is, for example, proton injection. By the ion implantation, a current confinement layer 3018 is formed inside the optical semiconductor structure 3160 including the DBR 3170 in the light-emitting device region. The current confinement layer 3018 may have a ring configuration.

Then, according to the technique described in reference to FIG. 5C, the mask 3001 is removed; subsequently, the current confinement layer 3018 including a portion of the first cladding layer 3161, the optical semiconductor structure of the light-receiving device, and the DBR each are mesa-patterned into truncated circular conical configurations; further, the first cladding layer 3161 is separated to separate the light-emitting device and the light-receiving device. Thereby, the first cladding layer 3161 is separated into a first cladding layer 3161a of the light-emitting device and a first cladding layer 3161b of the light-receiving device; and the optical semiconductor structure 3160 including the first light confinement layer 3162, the active layer 3163, the second light confinement layer 3164, and the second cladding layer 3165 and the DBR 3170 made of the stacked body of the semiconductor layers 3171 and 3172 having different refractive indexes also are separated into an optical semiconductor structure 3160a including a first light confinement layer 3162a, an active layer 3163a, a second light confinement layer 3164a, and a second cladding layer 3165a and a DBR 3170a made of the stacked body of semiconductor layers 3171a and 3172a having different refractive indexes of the light-emitting device, and into an optical semiconductor structure 3160b including a first light confinement layer 3162b, an active layer 3163b, a second light confinement layer 3164b, and a second cladding layer 3165b and a DBR 3170b made of the stacked body of semiconductor layers 3171b and 3172b having different refractive indexes of the light-receiving device.

Finally, according to the technique described in reference to FIG. 5C, insulating films 2019a and 2019b, electrodes 2201a and 2201b, and electrodes 2022a and 2202b are formed respectively in the light-emitting device structure and the light-receiving device structure. Thus, an optical semiconductor device is manufactured in which the semiconductor light-emitting device (the laser diode) LD and the semiconductor light-receiving device (the photodiode) PD are provided on the same substrate.

As described above, the semiconductor light-emitting device LD has the same structure as the semiconductor light-emitting device 10 described in reference to FIG. 1. Also, the optical semiconductor structure 3160a of the semiconductor light-emitting device LD and the optical semiconductor structure 3160b of the semiconductor light-receiving device PD have the same layer configurations and constituent materials. Similarly, the DBR 3170a of the semiconductor light-emitting device LD and the DBR 3170b of the semiconductor light-receiving device have the same layer configurations and constituent materials. Although the main material and the dielectric material included in the first structure body layers 2013a and 2013b likewise are the same, the period of the change of the refractive index may be different.

The optical semiconductor structure of the semiconductor light-emitting device and the optical semiconductor structure of the semiconductor light-receiving device may have the same layer structure and may be formed of the same semiconductor material.

As described above, the structure of the Group III-V compound semiconductor including the second light-reflecting structure formed in the upper portion of the first semiconductor structure is not limited and may be appropriately selected to match the application of the semiconductor device.

In the embodiment described above, although the current confinement structure that is included in the optical semiconductor structure including the active layer is provided by the current confinement layer formed by ion implantation into the optical semiconductor structure, the current confinement structure is not limited thereto. For example, the current confinement layer can be provided inside the optical semiconductor structure by oxidization. For example, the current confinement layer can be formed by interposing a layer for oxidization (in the case of a GaAs-based light-emitting device, for example, an AlGaAs layer; in the case of an InP-based light-emitting device, for example, InAlAs; the thicknesses each being, for example, 50 nm to 100 nm) between the light confinement layer and the cladding layer and by oxidizing by wet oxidation. Or, the current confinement structure can be provided by forming a semi-insulating semiconductor layer (in the case of a GaAs-based light-emitting device, for example, undoped GaAs; in the case of an InP-based light-emitting device, Fe-doped InP or Ru-doped InP) to surround the optical semiconductor structure (and the DBR) patterned into the high-mesa structure. Further, the current confinement structure can be provided by forming an insulating polymer (e.g., a polyimide) to surround the optical semiconductor structure (and the DBR) patterned into the high-mesa structure. Further, the current confinement structure can be provided by simply patterning the optical semiconductor structure (and the DBR) into the high-mesa structure (e.g., the mesa width having a diameter of 2 to 10 μm).

The method for manufacturing the semiconductor light-emitting device according to the embodiment includes a first process of forming a first light-reflecting structure, a process of bonding an optical semiconductor structure including an active layer on the first light-reflecting structure, a process of forming a second light-reflecting structure on the optical semiconductor structure, and a process of forming a pair of electrodes for providing a current to the optical semiconductor structure; and the first process includes a process of forming a patterned dielectric layer on a substrate, a process of forming a first high refractive index layer on the substrate and the dielectric layer, a process of planarizing the first high refractive index layer, a process of forming a mask layer on the first high refractive index layer, a process of forming a periodic structure having openings separated at a constant period in the mask layer and the first high refractive index layer, a process of forming a low refractive index layer on the mask layer and filling the periodic structure with the low refractive index layer, and a process of performing chemical mechanical polishing to cause the mask layer and the low refractive index layer to be substantially the same plane. By performing the manufacturing method, the optical semiconductor structure that is formed on the first semiconductor structure can be coplanar and in close contact over the entire surface. Thereby, the peeling at the bonding interface between the semiconductor structure body layer 13 and the optical semiconductor structure can be suppressed; and even in the case where the device is exposed to a temperature change, the stability of the device improves; and the yield and/or the productivity when manufacturing the semiconductor device can be increased.

Second Embodiment

The portions of the manufacturing method and the materials of the embodiment that are the same as those of the semiconductor light-emitting device described in the first embodiment are omitted.

In the semiconductor light-emitting device that is manufactured by the method for manufacturing the semiconductor light-emitting device according to the embodiment, the first light-reflecting structure 13 is provided on the substrate 11 with the dielectric layer (e.g., the silicon oxide layer) 12 interposed. The first light-reflecting structure 13 includes the first structure body layer in which the refractive index changes periodically in the in-plane direction. The first structure body layer 13 includes a high refractive index region having a relatively high refractive index and a low refractive index region having a relatively low refractive index that are two-dimensionally arranged periodically. More specifically, the first structure body layer 13 can include a photonic crystal. In other words, in the first structure body layer 13, a high refractive index layer made of a high refractive index material is used as the main material; and a dielectric material having a lower refractive index than the main material is buried at a constant spacing in the main material. Also, in the first structure body layer 13, the main material may be formed to have a constant spacing; and a dielectric material that has a low refractive index may be disposed in portions formed at a constant spacing in the main material. Thus, the main material contacts the buried layer. Polysilicon and amorphous silicon are examples of the main material; and silicon oxide, silicon nitride, silicon oxynitride, aluminum nitride, aluminum oxide, an ITO layer, an InTiO$_x$ layer, and an InWO$_x$ layer are examples of the dielectric material. In FIG. 1, the multiple openings 132 pierce the polysilicon or amorphous silicon included in the main material 131 at a constant spacing; and the dielectric 14 fills the openings 132.

The method for manufacturing the semiconductor device according to the embodiment will now be described. The method for manufacturing the semiconductor device according to the embodiment is an example of a method for manufacturing the semiconductor laser device shown in FIG. 1 in which the substrate 11 is a heterosubstrate formed of a different type of semiconductor material from the semiconductor of the optical semiconductor structure 16.

Figure 13:
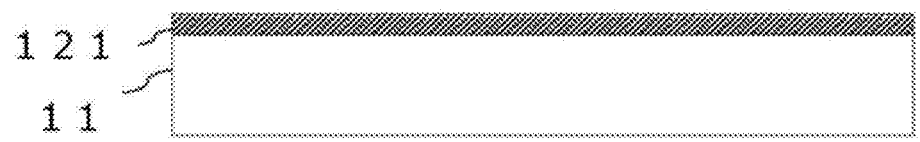
FIG. 13 is a drawing for describing steps 1 to 5 of a method for manufacturing a first semiconductor structure of a method for manufacturing a semiconductor light-emitting device according to a second embodiment.
Figure 13:
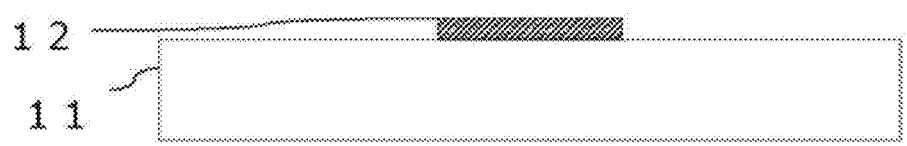
Figure 13:
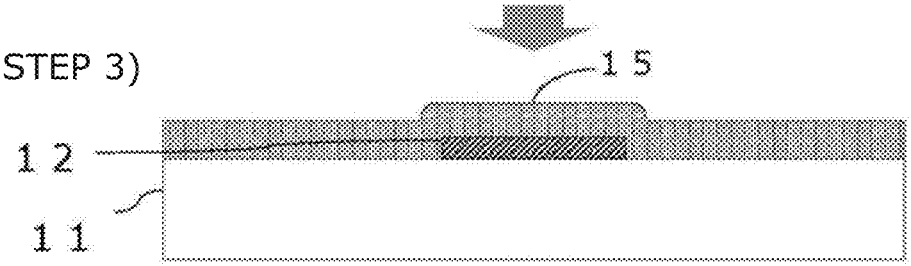
Figure 13:
Figure 13:
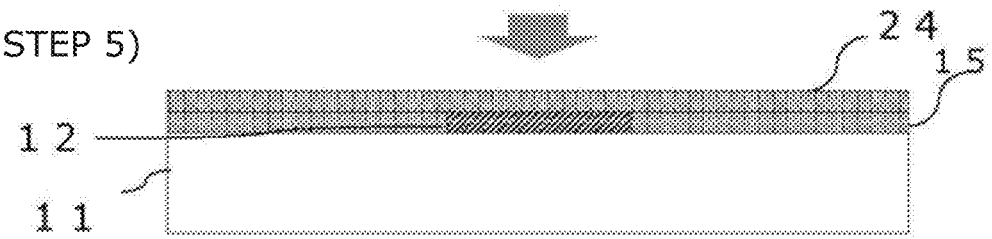

First, as shown in FIG. 13, the precursor layer 121 is formed on the heterosubstrate 11 which is a silicon substrate or the like (step 1).

Then, the precursor layer 121 is patterned; and the dielectric layer 12 is formed (step 2). The silicon layer 15 is formed as a high refractive index layer on the patterned dielectric layer 12 (step 3). The silicon layer 15 exists on both the patterned dielectric layer 12 and the silicon substrate 11. In such a case, the silicon layer 15 may include poly-Si (polysilicon), amorphous silicon, etc. The silicon layer 15 has the same meaning as the buried layer 15.

Then, the silicon layer 15 is cut away and planarized until the surface of the dielectric layer 12 on the side opposite to the surface contacting the heterosubstrate is exposed (step 4). That is, the silicon layer 15 and the surface of the dielectric layer 12 on the side opposite to the surface contacting the heterosubstrate are coplanar.

Subsequently, an amorphous silicon layer 24 is formed as a high refractive index layer on the dielectric layer 12 and the silicon layer 15 caused to be coplanar in step 4 (step 5). At this time, the front surface of the amorphous silicon layer is formed to be parallel to the front surface of the dielectric layer 12 and the silicon layer 15 caused to be coplanar in step 4. The second silicon layer 24 also can be called a buried layer.

Figure 14:
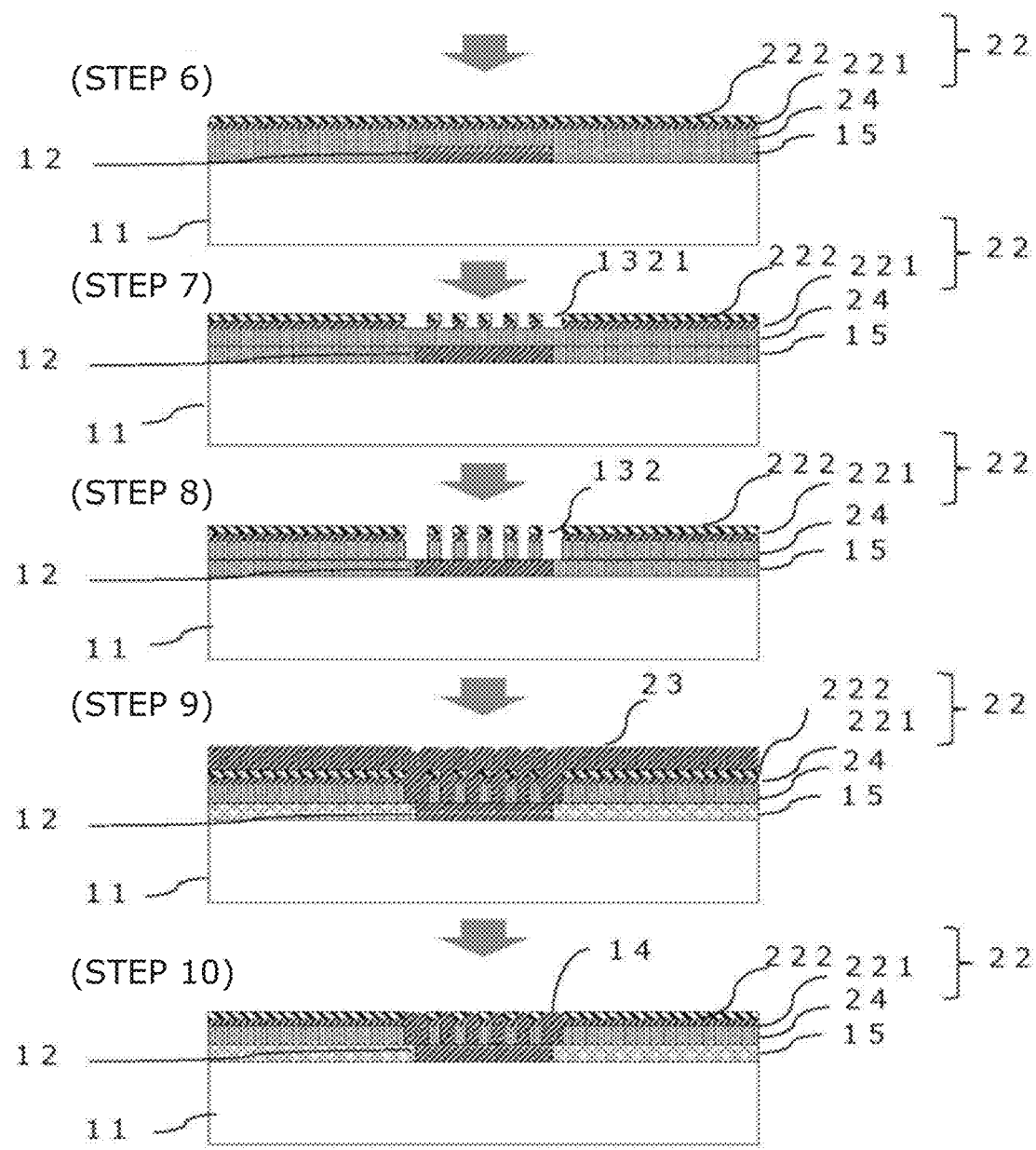
FIG. 14 is a drawing for describing steps 6 to 10 of the method for manufacturing the first semiconductor structure of the method for manufacturing the semiconductor light-emitting device according to the second embodiment.

As shown in FIG. 14, the second silicon oxide layer 221 and the silicon nitride layer 222 are formed on the amorphous silicon layer 24 formed in step 5 (step 6). At this time, the second silicon oxide layer 221 is provided on the amorphous silicon layer 24; and the silicon nitride layer 222 is provided on the second silicon oxide layer 221. The second silicon oxide layer 221 and the silicon nitride layer 222 are used as a mask in step 7 described below and therefore are called the mask layer 22.

Then, a periodic structure that has the openings 1321 separated at a constant period is formed in the mask layer 22 by performing HCG patterning of the mask layer 22 that is formed (step 7).

After performing the HCG patterning, further etching of the amorphous silicon layer 24 is performed (step 8). A periodic structure that has openings separated by the same constant period as the periodic structure having openings 1321 separated at the constant period is formed using the second silicon oxide layer 221 and the silicon nitride layer 222 after the HCG patterning in step 7 as a mask. Thereby, openings that are separated at a constant period are formed in the amorphous silicon layer. The positions and the configurations of the openings 132 can be provided to match the openings 1321 formed in step 7 and the openings formed in step 8. The first periodic structure can be formed because the openings 132 exist. The refractive index changes periodically in the in-plane direction in the first periodic structure. Also, the amorphous silicon layer 24 that is not etched exists as the main material 131. Polysilicon may exist as the main material.

Subsequently, the third silicon oxide layer 23 is formed as a low refractive index layer on the silicon nitride layer 222 (step 9). At this time, the third silicon oxide layer 23 is formed to fill the openings 132 so that gaps do not remain in the openings 132. The third silicon oxide layer 23 after step 10 also is called the pre-dielectric 23 because the third silicon oxide layer 23 becomes the dielectric 14.

The third silicon oxide layer 23 after step 9 is planarized by CMP (step 10). By planarizing, the openings 132 are filled with the third silicon oxide layer 23 without leaving gaps; and the third silicon oxide layer 23 that exists in the openings 132 becomes the dielectric 14. The front surface of the first structure body layer 13 and the front surface of the buried layer 15 each are flat and substantially coplanar.

MODIFICATION

A modification of the method for manufacturing the semiconductor light-emitting device according to the embodiment will now be described. Steps 1 to 5 are common between the modification and the manufacturing method described above; and a description of these portions is therefore omitted. The portions that are different from the manufacturing method described above will now be described.

Figure 15:
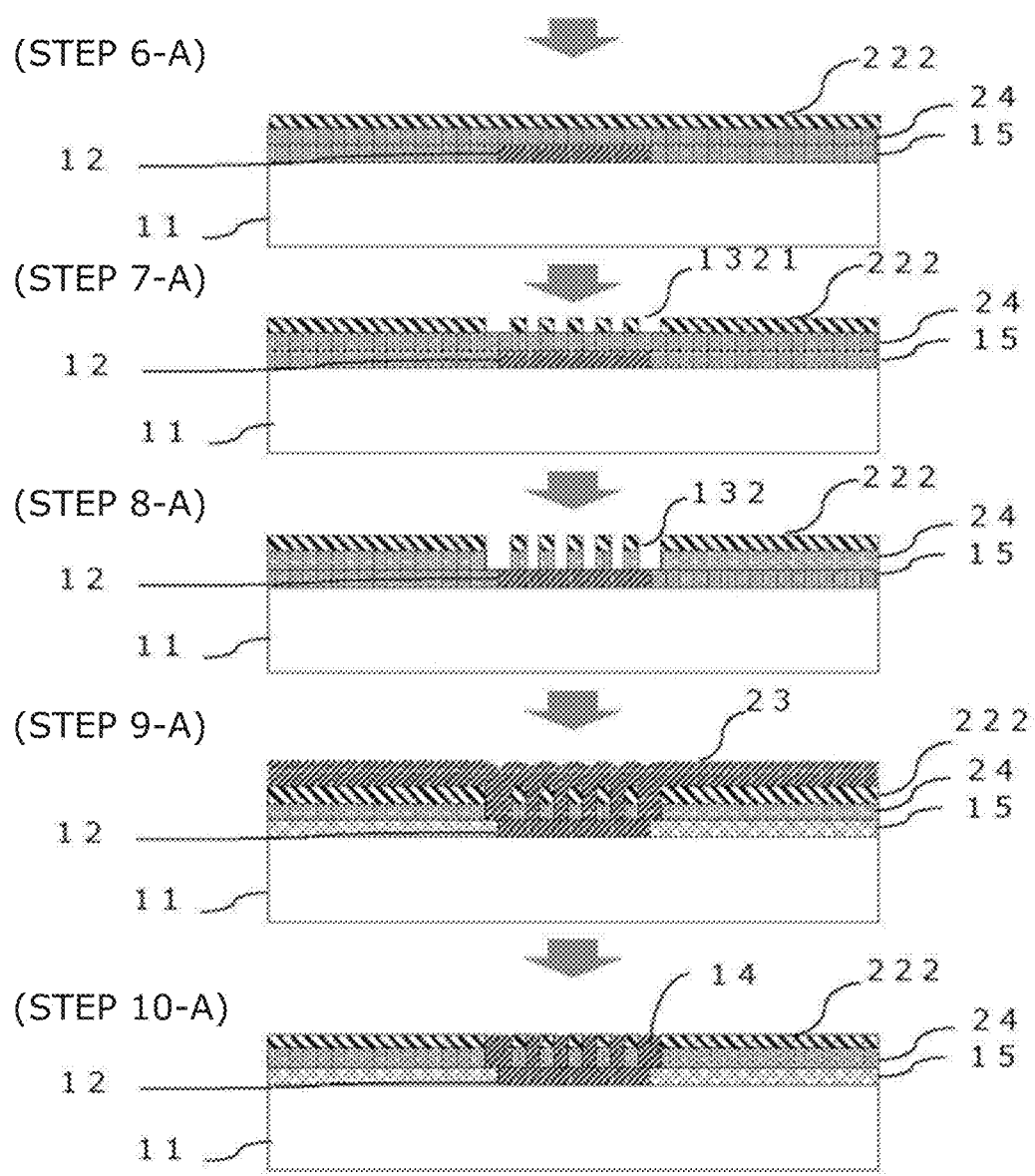
FIG. 15 is a drawing for describing steps 6 to 10 of the first modification of the method for manufacturing the first semiconductor structure of the method for manufacturing the semiconductor light-emitting device according to the second embodiment.

As shown in FIG. 15, the amorphous silicon layer 24 is formed; and the silicon nitride layer 222 is formed as the mask layer 22 on the amorphous silicon layer 24 (step 6-A). Thus, by forming the silicon nitride layer 222 on the amorphous silicon layer 24, excessive cutting away of the amorphous silicon layer 24 can be prevented when performing HCG patterning in step 7-A described below.

Then, openings 1321 that are separated at a constant period are formed in the silicon nitride layer 222 by performing HCG patterning of the silicon nitride layer 222 (step 7-A).

Other than the second silicon oxide layer not existing, the subsequent processes, i.e., step 8-A to 10-A, are the same as steps 8 to 10 of the method for manufacturing the semiconductor light-emitting device according to the second embodiment described above.

The semiconductor layer described in the first embodiment can be used as the semiconductor layer including the second light-reflecting structure; and a description is therefore omitted.

The method for manufacturing the first reflective structure of the method for manufacturing the semiconductor light-emitting device according to the second embodiment is applicable also to the first light-diffusing structure of the semiconductor light-receiving device.

In the manufacturing method according to the embodiment, the process of planarizing the first high refractive index layer includes a process of planarizing the first high refractive index layer, exposing the dielectric layer, and forming the second high refractive index layer on the first high refractive index layer and the dielectric layer; and instead of the process of forming the mask layer on the first high refractive index layer and the process of forming the periodic structure having the openings separated at the constant period in the mask layer and the first high refractive index layer, the manufacturing method includes a process of forming the mask layer on the second high refractive index layer and a process of forming a periodic structure having openings separated at a constant period in the mask layer and the second high refractive index layer. By performing such a manufacturing method, the material properties of the buried layer of the periphery and the material properties of the HCG structure can be selected appropriately.

Further, the optical semiconductor structure that is formed on the first semiconductor structure can be coplanar and in close contact over the entire surface. Thereby, the peeling at the bonding interface between the semiconductor structure body layer 13 and the optical semiconductor structure can be suppressed; and even in the case where the device is exposed to a temperature change, the stability of the device improves; and the yield and/or the productivity when manufacturing the semiconductor device can be increased.

Third Embodiment

The portions of the manufacturing method and the materials of the embodiment that are the same as those of the semiconductor light-emitting devices described in the first and second embodiments are omitted.

The first light-reflecting structure 13 is provided on the substrate 11 with the dielectric layer (e.g., the silicon oxide layer) 12 interposed. The first light-reflecting structure 13 includes the first structure body layer in which the refractive index changes periodically in the in-plane direction. The first structure body layer 13 includes a high refractive index region having a relatively high refractive index and a low refractive index region having a relatively low refractive index that are two-dimensionally arranged periodically. More specifically, the first structure body layer 13 can include a photonic crystal. In other words, in the first structure body layer 13, a high refractive index layer made of a high refractive index material is used as the main material; and a dielectric material having a lower refractive index than the main material is buried at a constant spacing in the main material. Also, in the first structure body layer 13, the main material may be formed to have a constant spacing; and a dielectric material that has a low refractive index may be disposed in portions formed at a constant spacing in the main material. Thus, the main material contacts the buried layer. Polysilicon and amorphous silicon are examples of the main material; and silicon oxide, silicon nitride, silicon oxynitride, aluminum nitride, aluminum oxide, an ITO layer, an $InTiO_x$ layer, and an $InWO_x$ layer are examples of the dielectric material. In FIG. 1, the multiple openings 132 pierce the polysilicon or amorphous silicon included in the main material 131 at a constant spacing; and the dielectric 14 fills the openings.

A method for manufacturing the semiconductor device according to the embodiment will now be described. The method for manufacturing the semiconductor device according to the embodiment is an example of a method for manufacturing the semiconductor laser device shown in FIG. 1 in which the substrate 11 is a heterosubstrate formed of a different type of semiconductor material from the semiconductor of the optical semiconductor structure 16.

Figure 16:
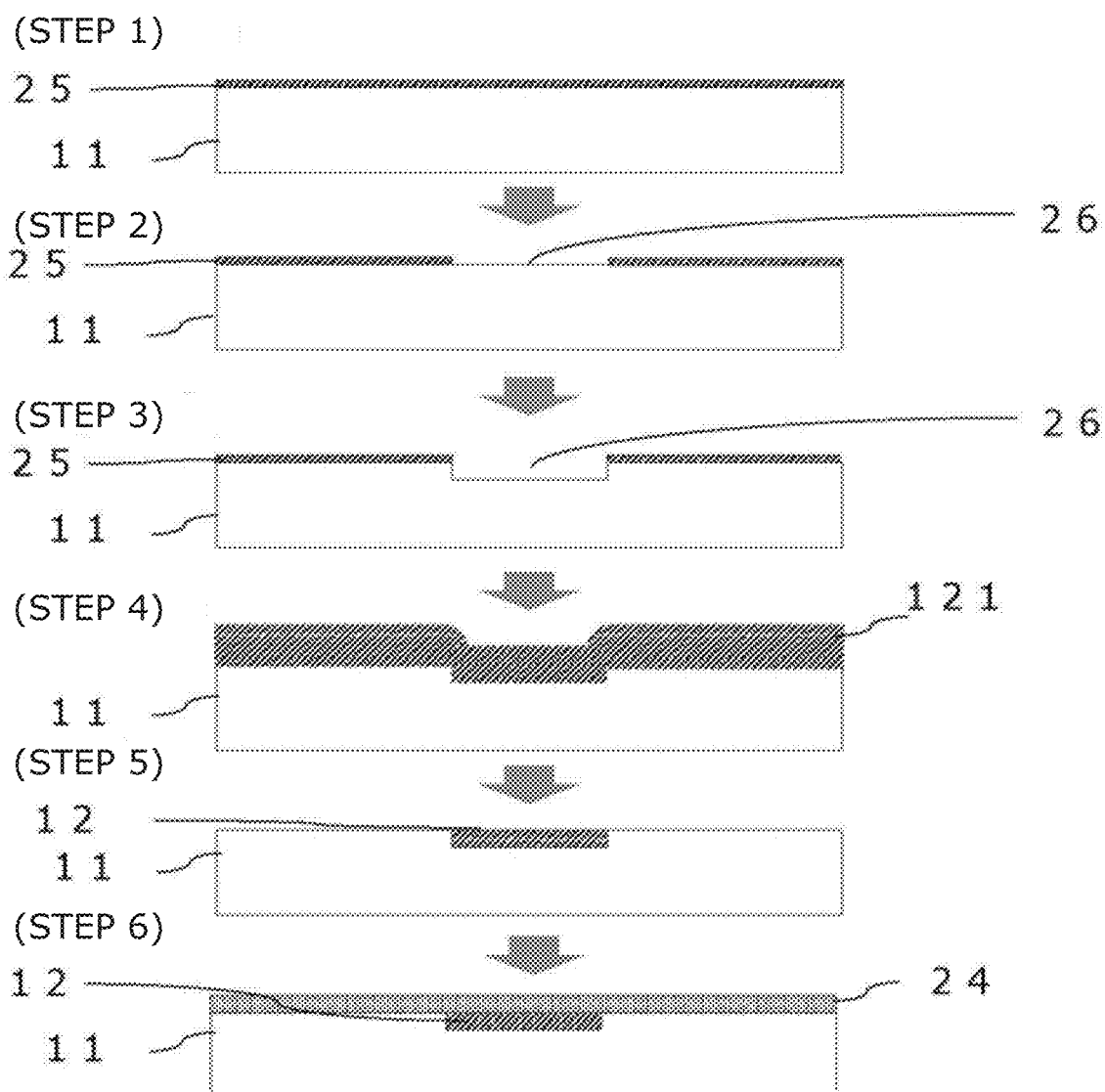
FIG. 16 is a drawing for describing steps 1 to 6 of a method for manufacturing a first semiconductor structure of a method for manufacturing a semiconductor light-emitting device according to a third embodiment.

First, as shown in FIG. 16, a first silicon oxide layer 25 is formed as a low refractive index layer on the substrate 11 such as a silicon substrate, etc. (step 1).

Then, the first silicon oxide layer 25 is patterned (step 2). In the embodiment, unlike the first embodiment and the second embodiment, the portion that remains as the dielectric layer 12 in the first embodiment and the second embodiment (hereinbelow, a dielectric layer portion 26) is removed. Thereby, the regions other than the dielectric layer portion are not etched when etching the substrate 11 in step 3 described below. That is, the patterning that is performed in step 2 is the formation of a mask layer for step 3.

Subsequently, the dielectric layer portion 26 of the heterosubstrate 11 is removed by etching (step 3). In the etching, caution is taken not to over-etch the heterosubstrate. For example, the heterosubstrate 11 is removed by etching 400 nm in the depth direction.

After step 3, a second silicon oxide layer (e.g., a silicon oxide layer) 121 is formed to cover the entirety of the heterosubstrate 11 and first silicon oxide layer 25 (step 4). At this time, the dielectric layer portion is formed to be filled with the second silicon oxide layer 121 without leaving gaps. The second silicon oxide layer also is called a precursor layer because the second silicon oxide layer becomes the dielectric layer after step 5.

The second silicon oxide layer 121 formed in step 4 and the first silicon oxide layer 25 are cut away so that the second silicon oxide layer 121 is planarized and the heterosubstrate 11 is exposed (step 5). At this time, the exposed surface of the heterosubstrate 11 and the exposed surface of the second silicon oxide layer 121 existing in the dielectric layer portion are planarized to be substantially the same. For example, CMP can be used to planarize. The second silicon oxide layer 121 becomes the dielectric layer 12 by the planarization.

The amorphous silicon layer 24 is formed as a high refractive index layer on the heterosubstrate 11 and the dielectric layer 12 (step 6). At this time, the amorphous silicon layer 24 is formed to be flat. The second silicon layer 24 also can be called a buried layer.

Figure 17:
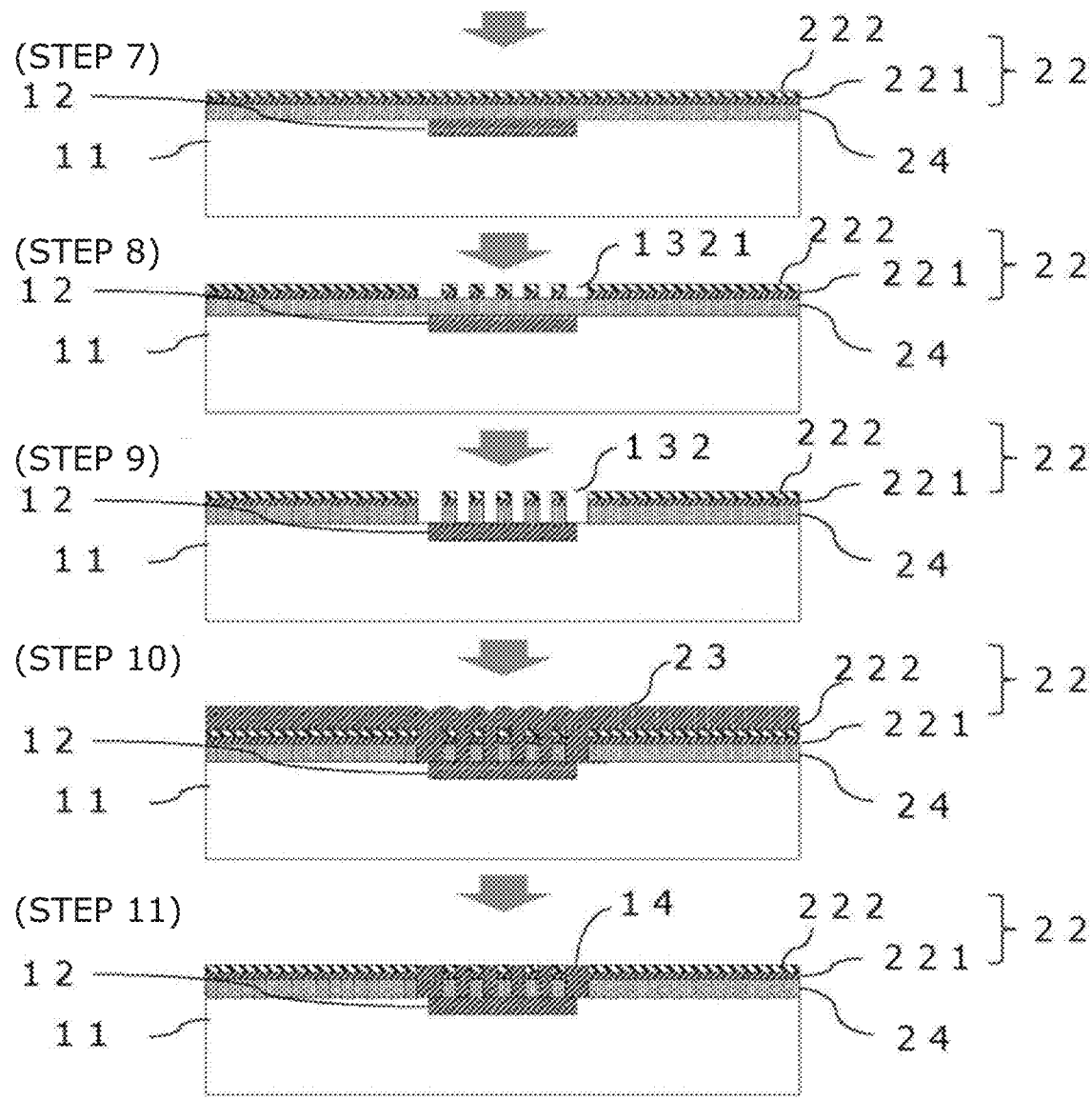
FIG. 17 is a drawing for describing steps 7 to 11 of the method for manufacturing the first semiconductor structure of the method for manufacturing the semiconductor light-emitting device according to the third embodiment.

As shown in FIG. 17, a third silicon oxide layer 221 and the silicon nitride layer 222 are formed on the amorphous silicon layer 24 formed in step 6 (step 7). At this time, the third silicon oxide layer 221 is provided on the amorphous silicon layer 24; and the silicon nitride layer 222 is provided on the third silicon oxide layer 221. The third silicon oxide layer 221 and the silicon nitride layer 222 are used as a mask for forming the periodic structure in step 8 described below and therefore are called the mask layer 22.

Then, a resist pattern of a periodic structure is formed on the third silicon oxide layer 221 and the silicon nitride layer 222 formed in step 7 by exposing a photoresist using photolithography, etc. Subsequently, the openings 1321 that are separated at a constant period are formed by performing dry etching of the third silicon oxide layer 221 and the silicon nitride layer 222 under the resist by using the resist as a mask (step 8).

After performing the HCG patterning, further etching of the amorphous silicon layer 24 is performed; and the openings 132 that are separated at a constant period are formed in the silicon layer, the third silicon oxide layer 221, and the silicon nitride layer 222 (step 9). The openings 132 can be provided so that the positions and the configurations match for the openings formed in step 8 and the openings formed in step 9. Also, the amorphous silicon layer 24 that is not etched exists as the main material 131. Polysilicon may exist as the main material. A periodic structure that has openings separated at a constant period is formed in the mask layer 22 and the high refractive index layer 24.

Subsequently, a fourth silicon oxide layer 23 is formed on the silicon nitride layer 222 (step 10). At this time, the fourth silicon oxide layer 23 is formed to fill the openings 132 so that gaps do not remain in the portion of the openings 132. The fourth silicon oxide layer 23 after step 11 also is called the pre-dielectric 23 because the fourth silicon oxide layer 23 becomes a dielectric.

After step 10, the fourth silicon oxide layer 23 is planarized by CMP (step 11). By planarizing, the fourth silicon oxide layer 23 exists without leaving gaps at the openings 132; the openings 132 are filled with the fourth silicon oxide layer 23 without leaving gaps; and the fourth silicon oxide layer 23 that exists in the openings 132 becomes the dielectric 14. The front surface of the first structure body layer 13 and the front surface of the mask layer 22 each are flat and substantially coplanar.

MODIFICATIONS

Modifications of the method for manufacturing the semiconductor light-emitting device according to the embodiment will now be described. The portions that are different from the manufacturing method described above will be described.

First Modification

The steps up to step 6 are common between a first modification and the method for manufacturing the semiconductor light-emitting device according to the third embodiment.

Figure 18:
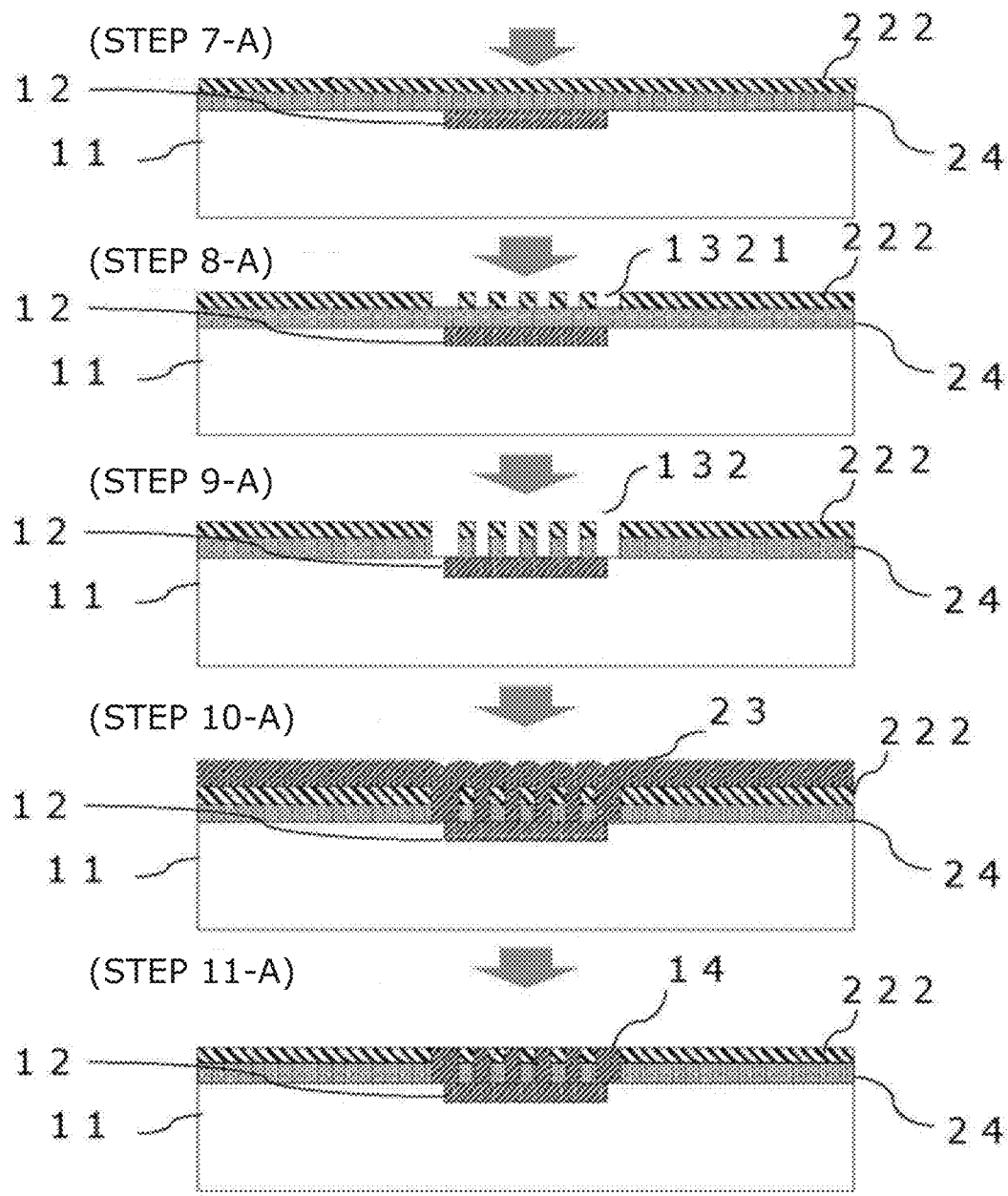
FIG. 18 is a drawing for describing steps 7 to 11 of a first modification of the method for manufacturing the first semiconductor structure of the method for manufacturing the semiconductor light-emitting device according to the third embodiment.

As shown in FIG. 18, the silicon nitride layer 222 is formed after forming the amorphous silicon layer 24 in step 6 (step 7-A). Thus, by forming the silicon nitride layer 222 on the amorphous silicon layer 24, excessive cutting away of the amorphous silicon layer 24 can be prevented when performing HCG patterning in step 8-A described below.

A resist pattern of a periodic structure is formed on the silicon nitride layer 222 formed in step 7-A by exposing a photoresist using photolithography, etc. Subsequently, the openings 132 that are separated at a constant period are formed by performing dry etching of the silicon nitride layer 222 under the resist by using the resist as a mask (step 8-A).

The subsequent processes, i.e., steps 8 to 10, are the same as those of the method for manufacturing the semiconductor light-emitting device according to the third embodiment described above. The silicon oxide layer 221 does not exist in step 8-A to 10-A in the first modification.

Second Modification

Steps 3 to 6 are common between a second modification and the manufacturing method according to the third embodiment described above; and a description of these portions is therefore omitted.

Figure 19:
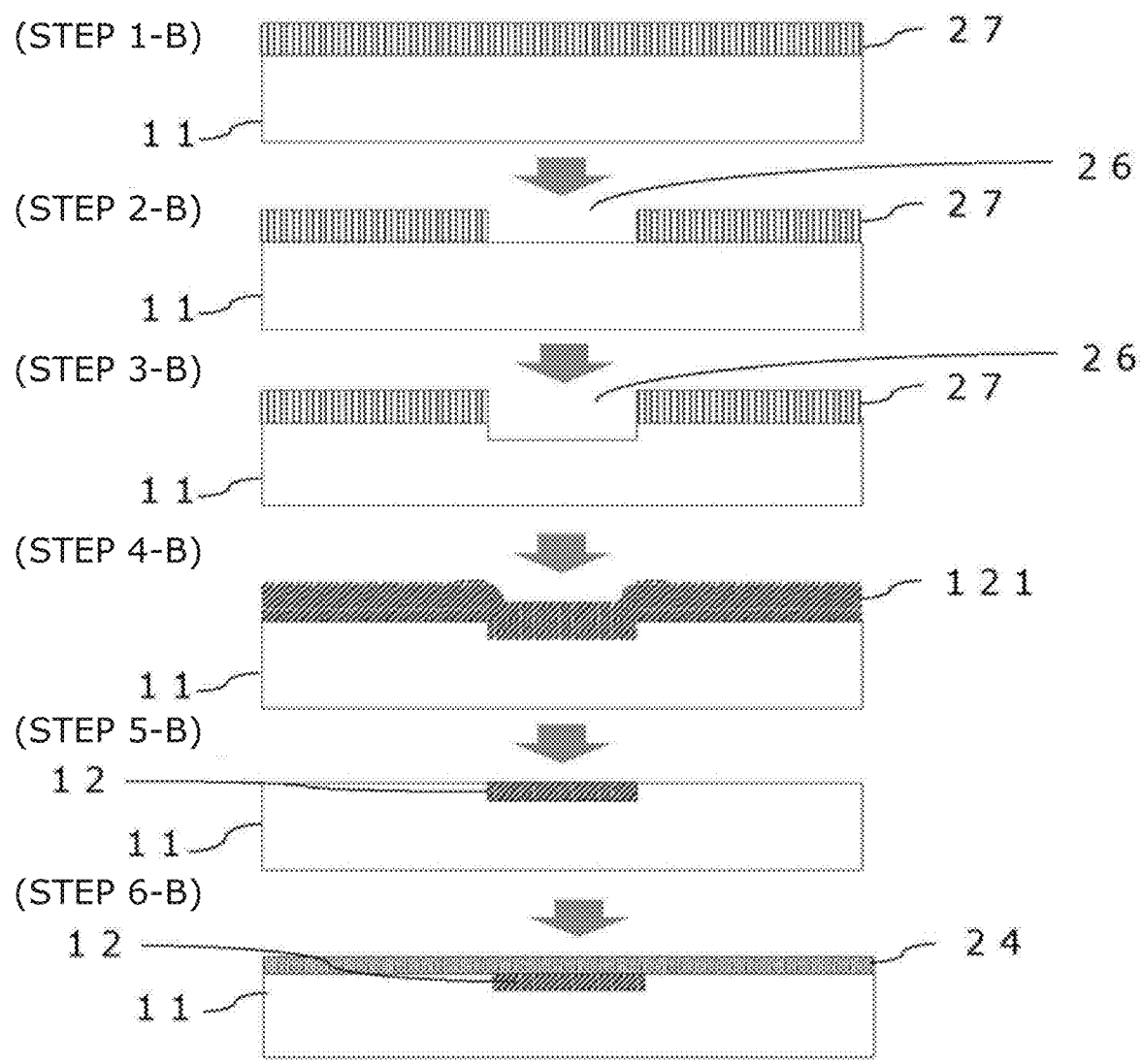
FIG. 19 is a drawing for describing steps 1 to 6 of a second modification of the method for manufacturing the first semiconductor structure of the method for manufacturing the semiconductor light-emitting device according to the third embodiment.

As shown in FIG. 19, first, a photoresist layer 27 is formed on a heterosubstrate (step 1-B). The photoresist that is used at this time can be selected appropriately.

Then, the photoresist layer 27 that exists at the dielectric layer portion 26 is removed by patterning (step 2-B). In the patterning, the dielectric layer portion 26 is formed on the substrate 11 by dry etching or wet etching using the photoresist or the like as a mask.

In the subsequent steps 3 to 11, other than removing the photoresist layer 27 in step 5, the same steps as steps 3 to 11 of the third embodiment are used and therefore are not described here.

Third Modification

The steps up to step 6 are common between a third modification and the second modification; and step 7 and subsequent steps are the same as step 7-A and subsequent steps of the first modification.

The semiconductor layer described in the first embodiment can be used as the semiconductor layer including the second light-reflecting structure; and a description is therefore omitted.

The method for manufacturing the first reflective structure of the method for manufacturing the semiconductor light-emitting device according to the third embodiment is applicable also to the first light-diffusing structure of the semiconductor light-receiving device.

The method for manufacturing the semiconductor device according to the embodiment includes a first process of forming a first light-reflecting structure, a process of bonding an optical semiconductor structure including an active layer on the first light-reflecting structure, a process of forming a second light-reflecting structure on the optical semiconductor structure, and a process of forming a pair of electrodes for providing a current to the optical semiconductor structure; and the first process includes a process of forming a first low refractive index layer on a substrate and patterning the first low refractive index layer, a process of patterning the substrate, a process of forming a precursor layer on the substrate and the first low refractive index layer, a process of forming a dielectric layer by planarizing the precursor layer and exposing the substrate so that the dielectric layer and the substrate form substantially the same plane, a process of forming a high refractive index layer on the substrate and the dielectric layer, a process of forming a mask layer on the high refractive index layer, a process of forming a periodic structure having openings separated at a constant period in the mask layer and the high refractive index layer, a process of forming a second low refractive index layer on the mask layer and filling the periodic structure with the second low refractive index layer, and a process of performing chemical mechanical polishing to cause the mask layer and the second low refractive index layer to be in substantially the same plane. By performing the manufacturing method, the periphery of the first light-reflecting structure can be the silicon substrate; therefore, the first light-reflecting structure can be stabilized.

The optical semiconductor structure that is formed on the first semiconductor structure can be coplanar and in close contact over the entire surface. Thereby, the peeling at the bonding interface between the semiconductor structure body layer 13 and the optical semiconductor structure can be suppressed; and even in the case where the device is exposed to a temperature change, the stability of the device improves; and the yield and/or the productivity when manufacturing the semiconductor device can be increased.

Fourth Embodiment

The portions of the manufacturing method and the materials of the embodiment that are the same as those of the semiconductor light-emitting device described in the first to third embodiments are omitted.

The first light-reflecting structure 13 is provided on the substrate 11 with the dielectric layer (e.g., the silicon oxide layer) 12 interposed. The first light-reflecting structure 13 includes the first structure body layer in which the refractive index changes periodically in the in-plane direction. The first structure body layer 13 includes a high refractive index region having a relatively high refractive index and a low refractive index region having a relatively low refractive index that are two-dimensionally arranged periodically. More specifically, the first structure body layer 13 can include a photonic crystal. In other words, in the first structure body layer 13, a high refractive index layer made of a high refractive index material is used as the main material; and a dielectric material having a lower refractive index than the main material is buried at a constant spacing in the main material. Also, in the first structure body layer 13, the main material may be formed to have a constant spacing; and a dielectric material that has a low refractive index may be disposed in portions formed at a constant spacing in the main material. Thus, the main material contacts the buried layer. Amorphous silicon is an example of the main material; and silicon oxide, silicon nitride, silicon oxynitride, aluminum nitride, aluminum oxide, an ITO layer, an $InTiO_x$ layer, and an $InWO_x$ layer are examples of the dielectric material. In FIG. 1, the multiple openings 132 pierce the polysilicon or amorphous silicon included in the main material 131 at a constant spacing; and the dielectric 14 fills the openings 132.

A method for manufacturing the semiconductor device according to the embodiment will now be described. The method for manufacturing the semiconductor device according to the embodiment is an example of a method for manufacturing the semiconductor laser device shown in FIG. 1 in which the substrate 11 is a heterosubstrate formed of a different type of semiconductor material from the semiconductor of the optical semiconductor structure 16.

Figure 20:
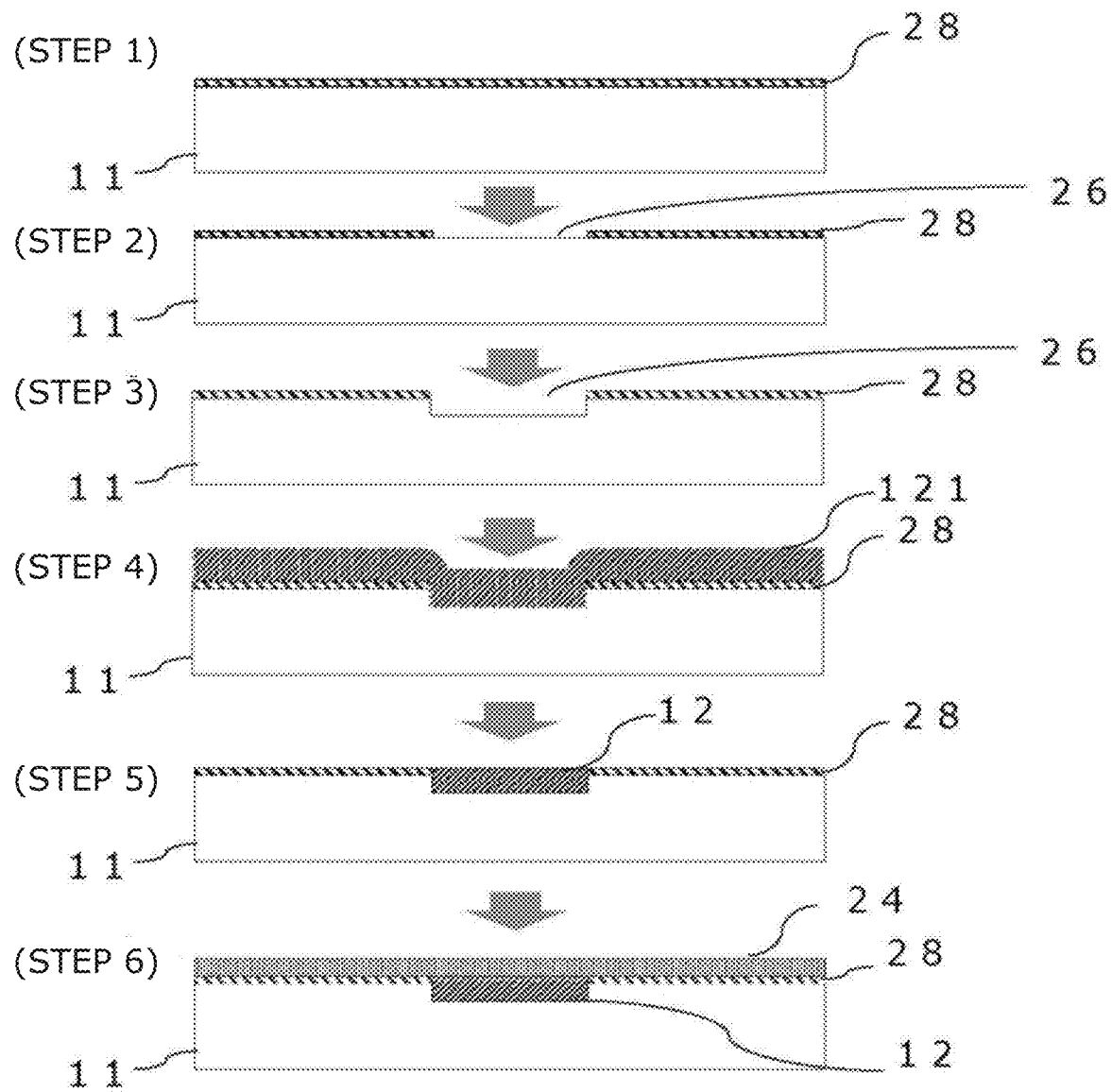
FIG. 20 is a drawing for describing steps 1 to 6 of a method for manufacturing a first semiconductor structure of a method for manufacturing a semiconductor light-emitting device according to a fourth embodiment.

First, as shown in FIG. 20, a first silicon nitride layer 28 is formed as a low refractive index layer on the heterosubstrate 11 which is a silicon substrate or the like (step 1).

Then, the first silicon nitride layer 28 is patterned (step 2). In the embodiment, the first silicon nitride layer 28 that exists in the portion corresponding to the dielectric layer portion 26 of the semiconductor light-emitting device is removed by patterning. In the patterning, the pattern is formed in the first silicon nitride layer 28 by dry etching or wet etching using the photoresist or the like as a mask.

Subsequently, the dielectric layer portion 26 of the heterosubstrate 11 is removed by etching (step 3). In the etching, caution is taken not to over-etch the heterosubstrate 11. For example, the heterosubstrate 11 is removed by etching 400 nm in the depth direction.

The silicon oxide layer 121 is formed as the precursor layer 121 to cover the entirety of both the heterosubstrate 11 and the first silicon nitride layer 28 (step 4). At this time, the dielectric layer portion 26 is formed to be filled with the silicon oxide layer 121 without leaving gaps.

Then, the dielectric layer 12 is formed by planarizing the silicon oxide layer 121 formed in step 4 (step 5). At this time, the planarization is performed so that the dielectric layer 12 and the first silicon nitride layer 28 are substantially coplanar.

The amorphous silicon layer 24 is formed as a high refractive index layer on the first silicon nitride layer 28 and the dielectric layer 12 caused to be coplanar in step 5 (step 6). At this time, the amorphous silicon layer 24 is formed so that the surface opposite to the surface contacting the first silicon nitride layer 28 and the dielectric layer 12 caused to be coplanar also is parallel to the first silicon nitride layer 28 and the dielectric layer 12 caused to be coplanar.

Figure 21:
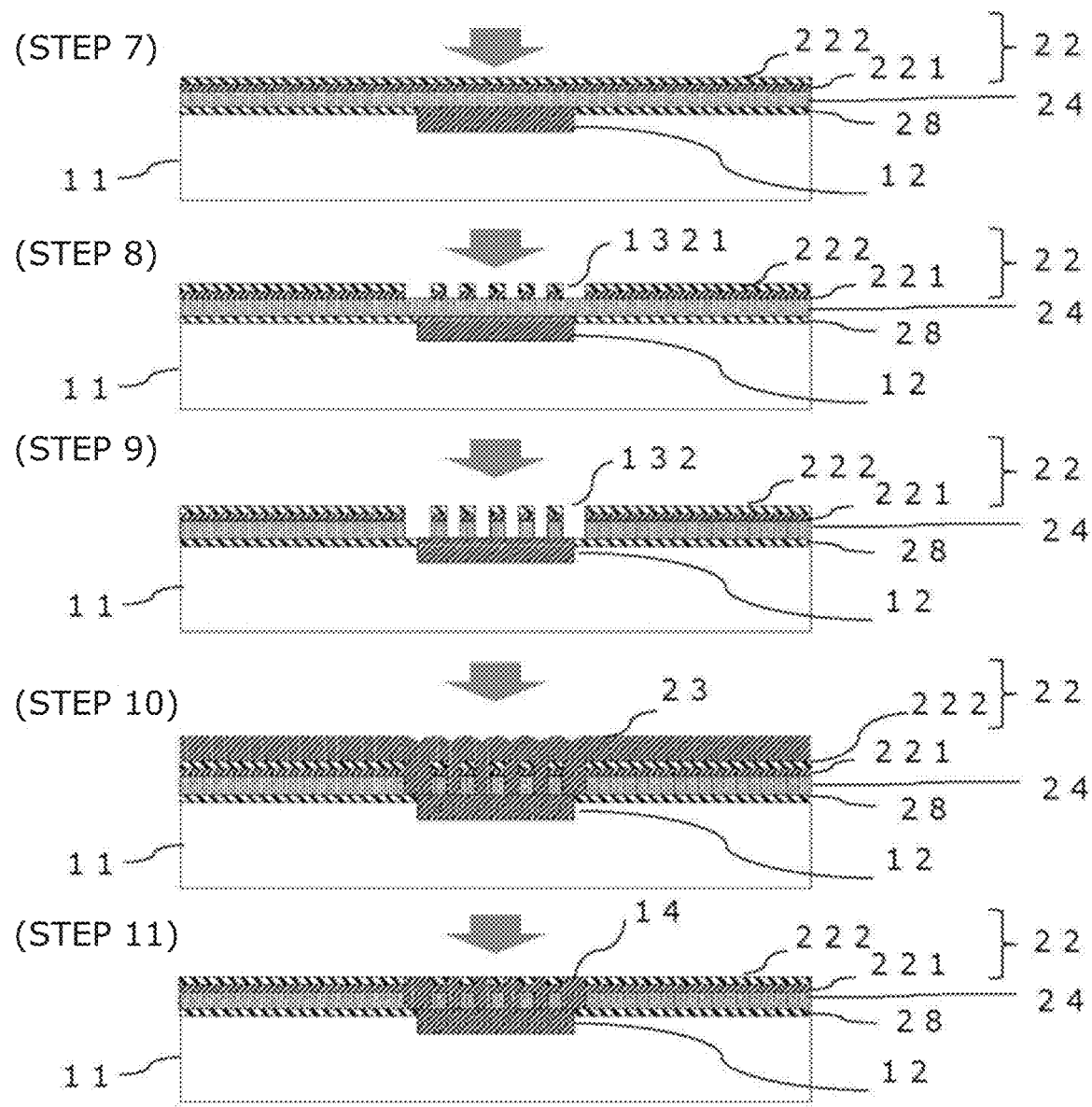
FIG. 21 is a drawing for describing steps 7 to 11 of the method for manufacturing the first semiconductor structure of the method for manufacturing the semiconductor light-emitting device according to the fourth embodiment.

As shown in FIG. 21, the second silicon oxide layer 221 is formed on the amorphous silicon layer 24 formed in step 6; and the second silicon nitride layer 222 is formed on the second silicon oxide layer 221 (step 7). At this time, the total thickness of the second silicon oxide layer 221 and the second silicon nitride layer 222 and the thickness of the amorphous silicon layer 24 are appropriately adjusted. The second silicon oxide layer 221 and the second silicon nitride layer 222 are used as a mask in step 10 described below and therefore are called the mask layer 22.

A resist pattern of a periodic structure is formed on the second silicon oxide layer 221 and the second silicon nitride layer 222 formed in step 7 by exposing a photoresist using photolithography, etc. Subsequently, the openings 1321 that are separated at the constant period are formed in the second silicon oxide layer 221 and the second silicon nitride layer 222 under the resist by using the resist as a mask (step 8).

After performing step 8, further etching of the amorphous silicon layer 24 is performed; and openings separated by the same constant period as the openings 1321 separated at the constant period made in step 8 are formed (step 9). Thereby, the openings 132 that are separated at the constant period can be formed in the amorphous silicon layer 24, the second silicon oxide layer 221, and the second silicon nitride layer 222. Thus, a periodic structure that has openings separated at a constant period is formed in the mask layer 22 and the high refractive index layer 24. The amorphous silicon layer 24 and the first silicon nitride layer 28 that are not etched exist as the main material 131. Polysilicon may exist as the main material.

Subsequently, the third silicon oxide layer 23 is formed on the second silicon nitride layer 222 (step 10). At this time, the third silicon oxide layer 23 fills the openings so that gaps do not remain in the portion of the openings. The third silicon oxide layer 23 after step 11 also is called the pre-dielectric 23 because the third silicon oxide layer 23 becomes the dielectric 14.

After step 10, the third silicon oxide layer 23 is planarized by CMP (step 11). By planarizing, the second silicon layer exists without leaving gaps in the openings 132; and the front surface of the first structure body layer 13 and the front surface of the second silicon nitride layer 222 each are flat and coplanar.

MODIFICATIONS

Modifications of the method for manufacturing the semiconductor light-emitting device according to the fourth embodiment will now be described. Steps 1 to 6 are common between the modifications and the method for manufacturing the semiconductor light-emitting device according to the fourth embodiment described above; and a description of these portions is therefore omitted. The portions that are different from the manufacturing method described above will be described.

First Modification

Figure 22:
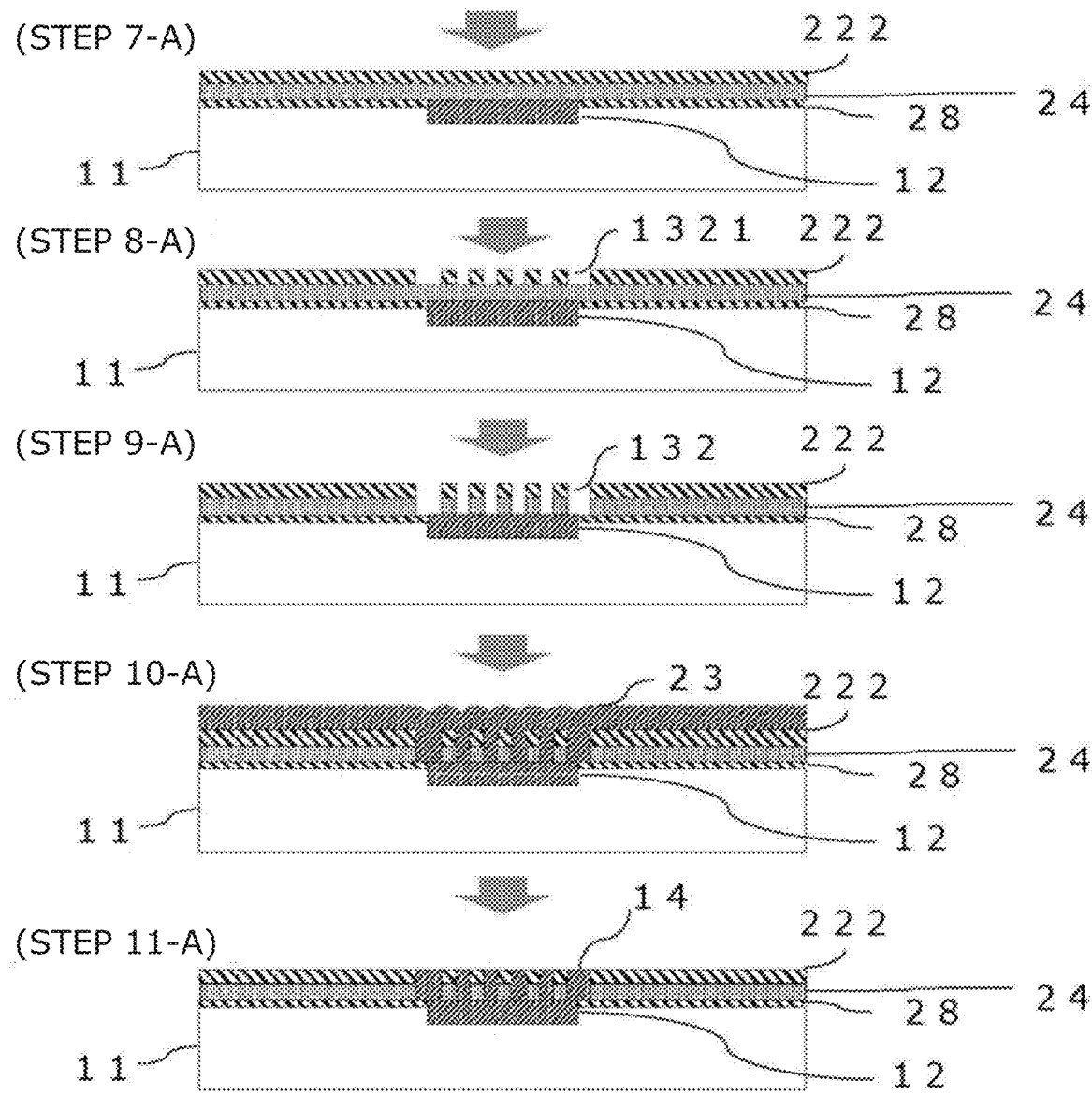
FIG. 22 is a drawing for describing steps 7 to 11 of a first modification of the method for manufacturing the first semiconductor structure of the method for manufacturing the semiconductor light-emitting device according to the fourth embodiment.

As shown in FIG. 22, the second silicon nitride layer 222 is formed on the amorphous silicon layer 24 (step 7-A). Thus, by forming the second silicon nitride layer 222 on the amorphous silicon layer 24, the excessive cutting away of the amorphous silicon layer 24 can be prevented when performing the HCG patterning in step 8-A described below.

Then, a resist pattern of a periodic structure is formed on the second silicon nitride layer 222 by exposing a photoresist using photolithography, etc. Subsequently, the openings 1321 that are separated at the constant period are formed by performing dry etching of the silicon nitride layer 222 under the resist by using the resist as a mask (step 8-A).

The subsequent processes, i.e., steps 9 to 11, are the same as those of the manufacturing method described above. The silicon oxide layer 221 does not exist in steps 9 to 11 of the modification.

Second Modification

Figure 23:
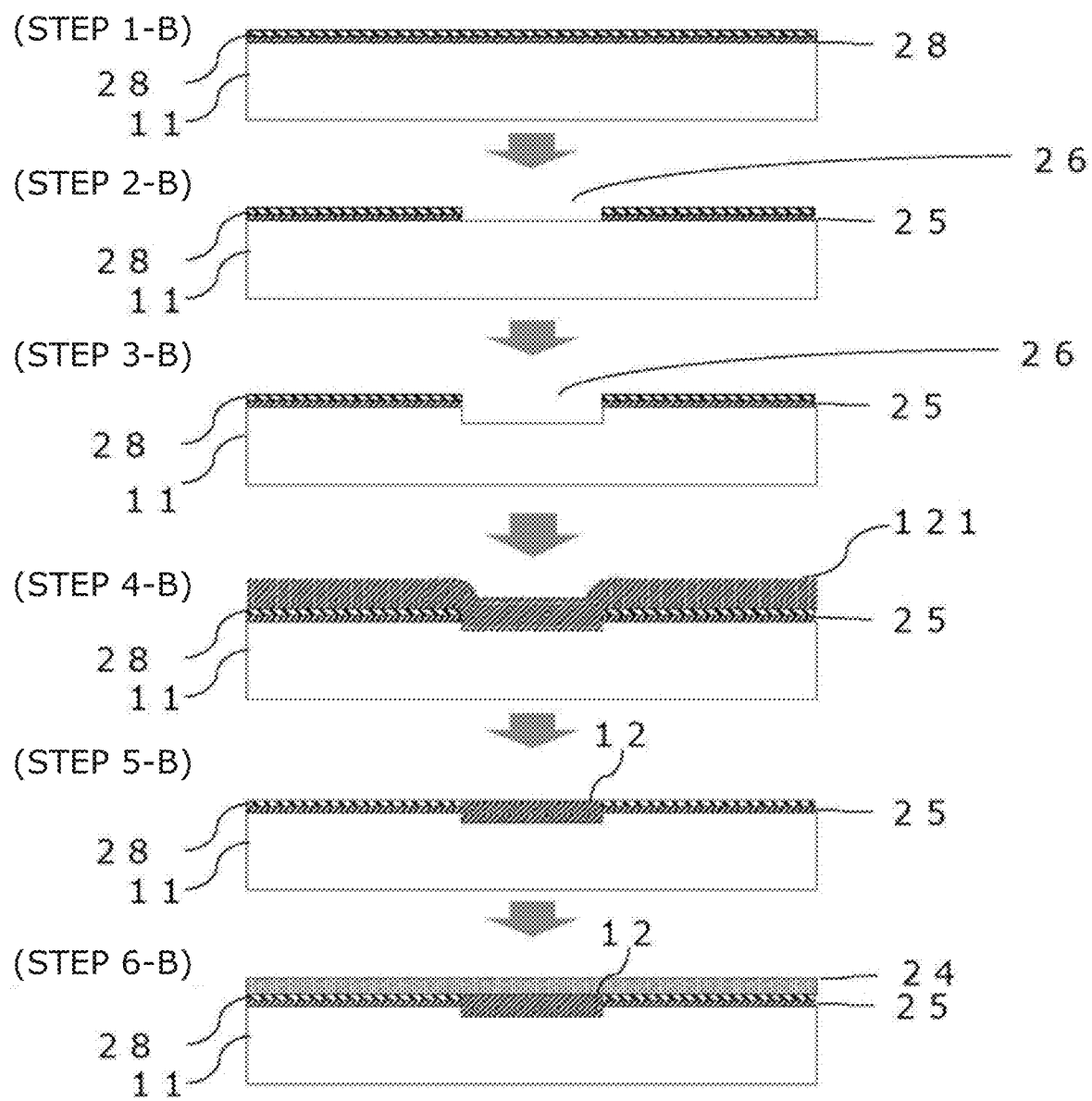
FIG. 23 is a drawing for describing steps 1 to 6 of a second modification of the method for manufacturing the first semiconductor structure of the method for manufacturing the semiconductor light-emitting device according to the fourth embodiment.

In the method for manufacturing the semiconductor light-emitting device according to the fourth embodiment, only the first silicon nitride layer 28 is formed on the heterosubstrate. In the second modification as shown in FIG. 23, the silicon oxide layer 25 is formed on the heterosubstrate; and the first silicon nitride layer 28 is formed on the silicon oxide layer 25 (step 1-B). The silicon oxide layer 25 that is formed in this step 1-B is called the fourth silicon oxide layer 25.

In the subsequent step 2-B to step 6-B, the fourth silicon oxide layer 25 is handled to match the handling of the first silicon nitride layer 28 in step 2 to step 6 of the method for manufacturing the semiconductor light-emitting device according to the fourth embodiment. That is, for example, the fourth silicon oxide layer 25 is similarly patterned when performing the patterning of the first silicon nitride layer 28 in step 2 of the method for manufacturing the semiconductor light-emitting device according to the fourth embodiment.

Figure 24:
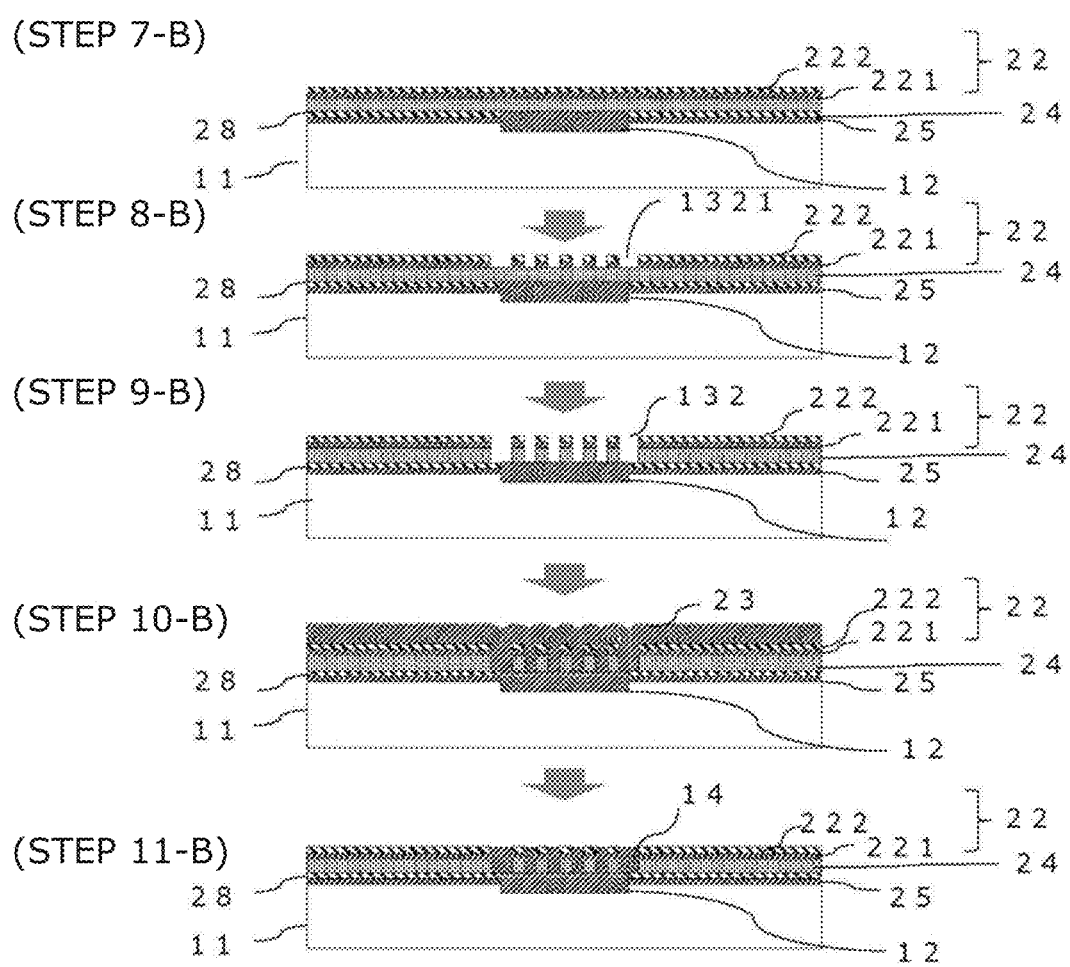
FIG. 24 is a drawing for describing steps 7 to 11 of the second modification of the method for manufacturing the first semiconductor structure of the method for manufacturing the semiconductor light-emitting device according to the fourth embodiment.

The processes of step 6-B and subsequent steps are similar to steps 7 to 11 of the method for manufacturing the semiconductor light-emitting device according to the fourth embodiment. The steps are taken as step 1-B to 11B for convenience in FIG. 23 and FIG. 24 showing the second modification of the method for manufacturing the semiconductor light-emitting device according to the fourth embodiment.

Third Modification

Figure 25:
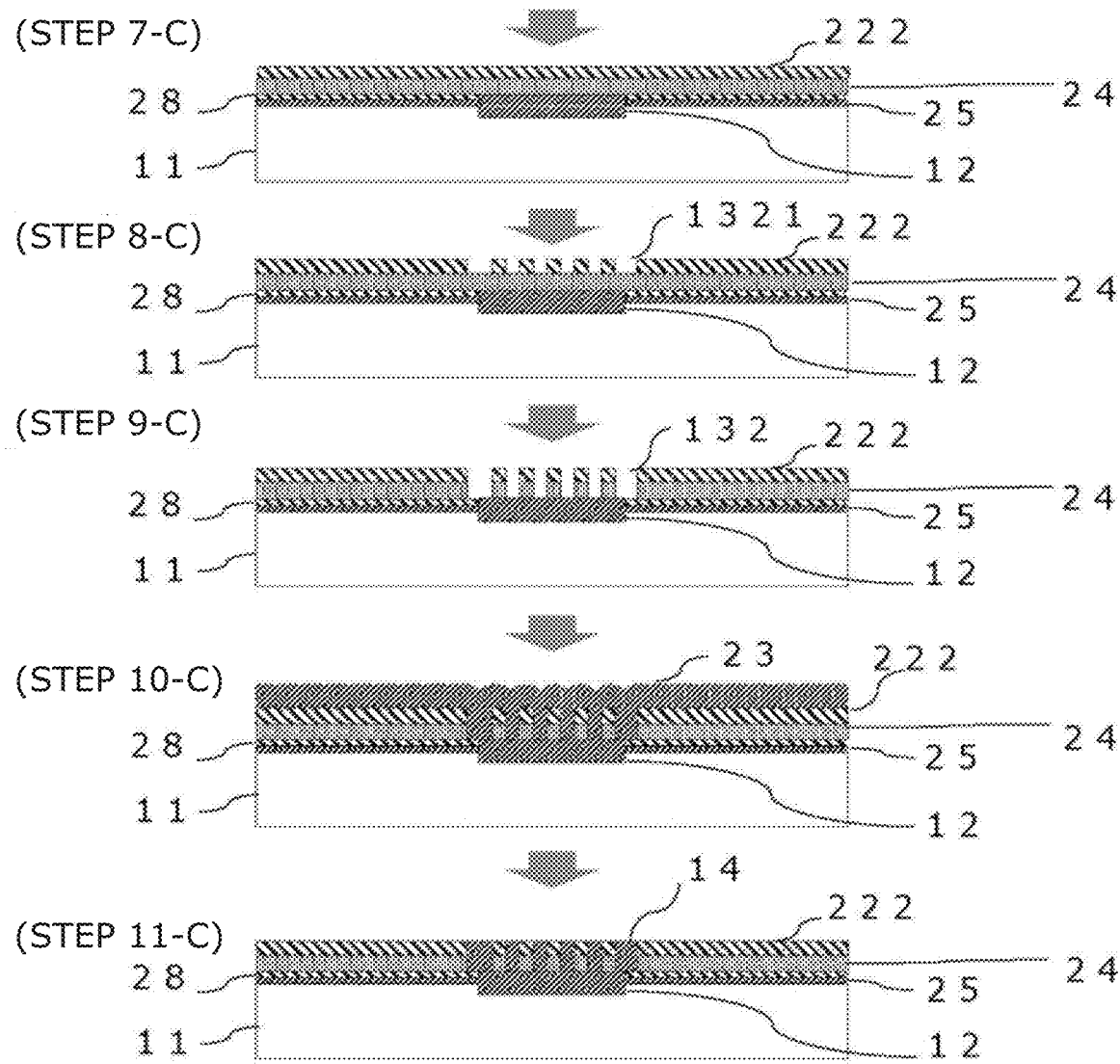
FIG. 25 is a drawing for describing steps 7 to 11 of a third modification of the method for manufacturing the first semiconductor structure of the method for manufacturing the semiconductor light-emitting device according to the fourth embodiment.

As shown in FIG. 25, a third modification is a manufacturing method in which step 1-B to step 6-B of the second modification according to the embodiment and step 7-A to step 11-A of the first modification according to the embodiment are combined. The steps in the drawings of the third modification of the method for manufacturing the semiconductor light-emitting device according to the fourth embodiment are taken as step 7-C to 11-C for convenience.

The semiconductor layer described in the first embodiment can be used as the semiconductor layer including the second light-reflecting structure; and a description is therefore omitted.

By performing the method for manufacturing the semiconductor device according to the embodiment, the silicon nitride layer can insulate the substrate while ensuring the heat dissipation.

The semiconductor layer described in the first embodiment can be used as the semiconductor layer including the second light-reflecting structure; and a description is therefore omitted.

The method for manufacturing the first reflective structure of the method for manufacturing the semiconductor light-emitting device according to the fourth embodiment is applicable also to the first light-diffusing structure of the semiconductor light-receiving device.

In the manufacturing method according to the embodiment, instead of the process of planarizing the dielectric layer, exposing the substrate, and causing the dielectric layer and the substrate to form substantially the same plane and the process of forming a high refractive index layer on the substrate and the dielectric layer, the method for manufacturing the semiconductor light-emitting device according to the third embodiment includes a process of planarizing the precursor layer, forming a dielectric layer, and causing the low refractive index layer and the dielectric layer to form substantially the same plane and a process of forming a high refractive index layer on the low refractive index layer and the dielectric layer. By performing the manufacturing method, the material properties of the buried layer of the periphery and the material properties of the HCG structure can be selected appropriately.

The optical semiconductor structure that is formed on the first semiconductor structure can be coplanar and in close contact over the entire surface. Thereby, the peeling at the bonding interface between the semiconductor structure body layer 13 and the optical semiconductor structure can be suppressed; and even in the case where the device is exposed to a temperature change, the stability of the device improves; and the yield and/or the productivity when manufacturing the semiconductor device can be increased.

Fifth Embodiment

The portions of the manufacturing method and the materials that are the same as those of the semiconductor light-emitting devices described in the first to fourth embodiments are omitted.

The first light-reflecting structure 13 is provided on the substrate 11 with the dielectric layer (e.g., the silicon oxide layer) 12 interposed. The first light-reflecting structure 13 includes the first structure body layer in which the refractive index changes periodically in the in-plane direction. The first structure body layer 13 includes a high refractive index region having a relatively high refractive index and a low refractive index region having a relatively low refractive index that are two-dimensionally arranged periodically. More specifically, the first structure body layer 13 can include a photonic crystal. In other words, in the first structure body layer 13, a high refractive index layer made of a high refractive index material is used as the main material; and a dielectric material having a lower refractive index than the main material is buried at a constant spacing in the main material. Also, in the first structure body layer 13, the main material may be formed to have a constant spacing; and a dielectric material that has a low refractive index may be disposed in portions formed at a constant spacing in the main material. Thus, the main material contacts the buried layer. Polysilicon and amorphous silicon are examples of the main material; and silicon oxide, silicon nitride, silicon oxynitride, aluminum nitride, aluminum oxide, an ITO layer, an $InTiO_x$ layer, and an $InWO_x$ layer are examples of the dielectric material. In FIG. 1, the multiple openings 132 pierce the polysilicon or amorphous silicon included in the main material 131 at a constant spacing; and the dielectric 14 fills the openings 132.

The method for manufacturing the semiconductor device according to the embodiment will now be described. The method for manufacturing the semiconductor device according to the embodiment is an example of a method for manufacturing the semiconductor laser device shown in FIG. 1 in which the substrate 11 is a heterosubstrate formed of a different type of semiconductor material from the semiconductor of the optical semiconductor structure 16.

Figure 26:
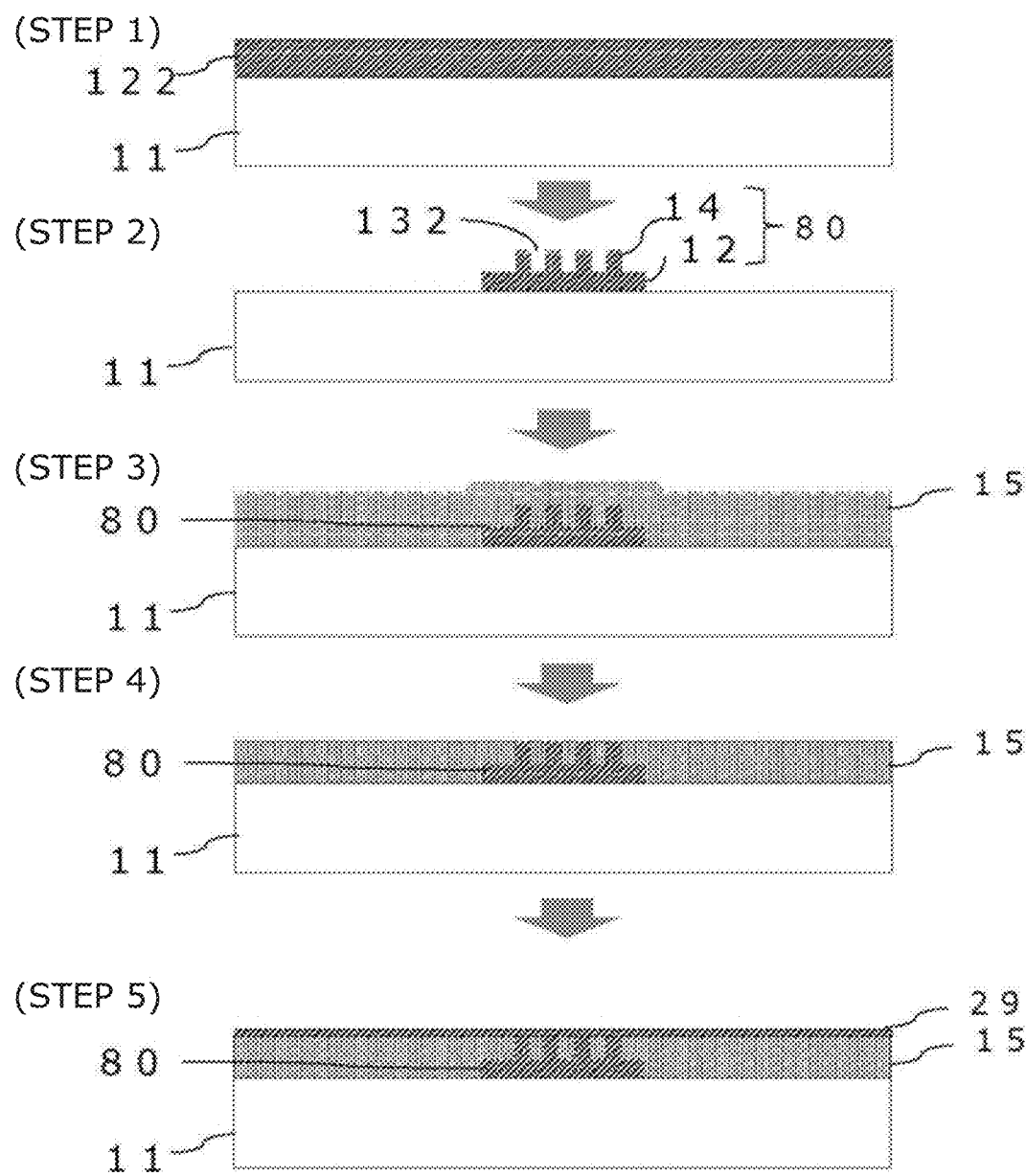
FIG. 26 is a drawing for describing steps 1 to 5 of a method for manufacturing a first semiconductor structure of a method for manufacturing a semiconductor light-emitting device according to a fifth embodiment.

First, as shown in FIG. 26, a silicon oxide layer (e.g., a silicon oxide layer, an ITO layer, an $InTiO_x$ layer, an $InWO_x$ layer, or the like) 122 is formed on the heterosubstrate 11 which is a silicon substrate or the like (step 1). The thickness of the silicon oxide layer 122 formed at this time is formed to be not less than the combined thickness of the dielectric layer 12 and the dielectric 14 in the semiconductor light-emitting device.

Then, the silicon oxide layer 122 is patterned (step 2). Unlike the patterning according to the first to fourth embodiments, the patterning of step 2 according to the embodiment patterns the dielectric layer 12 in step 2 to be the combination of the dielectric layer 12 and the dielectric 14, i.e., a dielectric portion 80, in the semiconductor light-emitting device and forms the dielectric layer 12 to have a periodic structure having the openings 132 separated at a constant period.

The silicon layer 15 is formed as a high refractive index layer on the patterned dielectric portion 80 (step 3). The silicon layer 15 exists on both the patterned dielectric portion 80 and the silicon substrate 11 and fills the openings. In such a case, the silicon layer 15 may include poly-Si (polysilicon), amorphous silicon, etc. The silicon layer 15 is the main material 131 and the buried layer 15.

Further, the planarization is performed so that the surface of the dielectric portion 80 patterned in step 2 on the side opposite to the surface contacting the heterosubstrate and the surface of the silicon layer 15 formed in step 3 on the side opposite to the surface contacting the heterosubstrate are substantially coplanar (step 4). At this time, the planarization is performed by CMP, etc.

A silicon oxide layer 29 is formed as a low refractive index layer on the planarized surfaces of the dielectric portion 80 and the silicon layer 15 formed in step 4 (step 5). The layer that is formed in this step 5 may be a single body of a silicon oxide layer, or a silicon oxide layer and a silicon nitride layer that are overlaid. The overlaying order is arbitrary in the case where the overlaid layers of the silicon oxide layer and the silicon nitride layer are used. That is, for example, either the silicon oxide layer or the silicon nitride layer may contact the planarized surfaces of the dielectric portion 80 and the silicon layer 15.

The semiconductor layer described in the first embodiment can be used as the semiconductor layer including the second light-reflecting structure; and a description is therefore omitted.

The method for manufacturing the first reflective structure of the method for manufacturing the semiconductor light-emitting device according to the fifth embodiment is applicable also to the first light-diffusing structure of the semiconductor light-receiving device.

The method for manufacturing the semiconductor light-emitting device according to the embodiment includes a first process of forming a first light-reflecting structure, a process of bonding an optical semiconductor structure including an active layer on the first light-reflecting structure, a process of forming a second light-reflecting structure on the optical semiconductor structure, and a process of forming a pair of electrodes for providing a current to the optical semiconductor structure; and the first process includes a process of forming a dielectric portion having a periodic structure on a substrate, a process of forming a high refractive index layer on the substrate and the dielectric portion, a process of planarizing the high refractive index layer and causing the high refractive index layer and the surface of the patterned dielectric portion not contacting the substrate to form substantially the same plane, and a process of forming a low refractive index layer on the same plane. By performing the manufacturing method, silicon oxide patterning can be used in which the number of processes is low and the patterning precision is high.

The optical semiconductor structure that is formed on the first semiconductor structure can be coplanar and in close contact over the entire surface. Thereby, the peeling at the bonding interface between the semiconductor structure body layer 13 and the optical semiconductor structure can be suppressed; and even in the case where the device is exposed to a temperature change, the stability of the device improves; and the yield and/or the productivity when manufacturing the semiconductor device can be increased.

Sixth Embodiment

The portions of the manufacturing method and the materials of the embodiment that are the same as those of the semiconductor light-emitting devices described in the first to fifth embodiments are omitted.

The first light-reflecting structure 13 is provided on the substrate 11 with the dielectric layer (e.g., the silicon oxide layer) 12 interposed. The first light-reflecting structure 13 includes the first structure body layer in which the refractive index changes periodically in the in-plane direction. The first structure body layer 13 includes a high refractive index region having a relatively high refractive index and a low refractive index region having a relatively low refractive index that are two-dimensionally arranged periodically. More specifically, the first structure body layer 13 can include a photonic crystal. In other words, in the first structure body layer 13, a high refractive index layer made of a high refractive index material is used as the main material; and a dielectric material having a lower refractive index than the main material is buried at a constant spacing in the main material. Also, in the first structure body layer 13, the main material may be formed to have a constant spacing; and a dielectric material that has a low refractive index may be disposed in portions formed at a constant spacing in the main material. Thus, the main material contacts the buried layer. Polysilicon and amorphous silicon are examples of the main material; and silicon oxide, silicon nitride, silicon oxynitride, aluminum nitride, aluminum oxide, an ITO layer, an $InTiO_x$ layer, and an $InWO_x$ layer are examples of the dielectric material. In FIG. 1, the multiple openings 132 pierce the polysilicon or amorphous silicon included in the main material 131 at a constant spacing; and the dielectric 14 fills the openings 132.

A method for manufacturing the semiconductor device according to the embodiment will now be described. The method for manufacturing the semiconductor device according to the embodiment is an example of a method for manufacturing the semiconductor laser device shown in FIG. 1 in which the substrate 11 is a heterosubstrate formed of a different type of semiconductor material from the semiconductor of the optical semiconductor structure 16.

Step 1 to step 4 are common between the method for manufacturing the semiconductor device according to the embodiment and the method for manufacturing the semiconductor device described in the second embodiment; and a description is therefore omitted.

Figure 27:
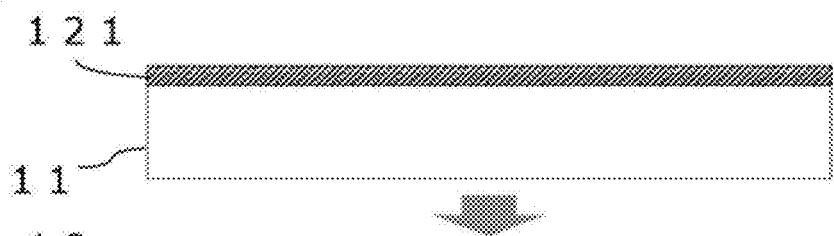
FIG. 27 is a drawing for describing steps 1 to 6 of a method for manufacturing a first semiconductor structure of a method for manufacturing a semiconductor light-emitting device according to a sixth embodiment.
Figure 27:
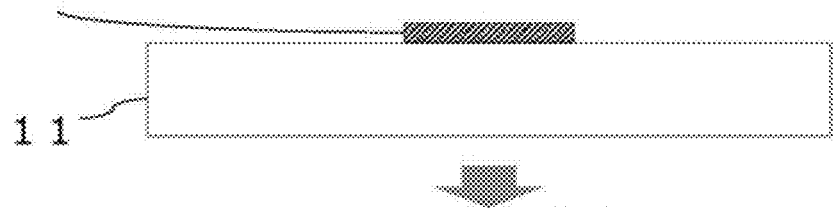
Figure 27:
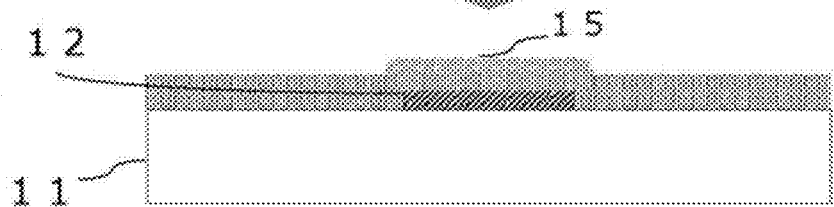
Figure 27:
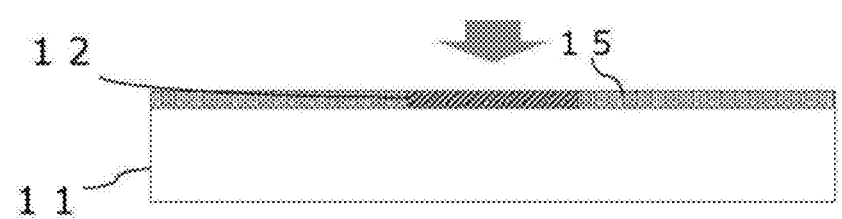
Figure 27:
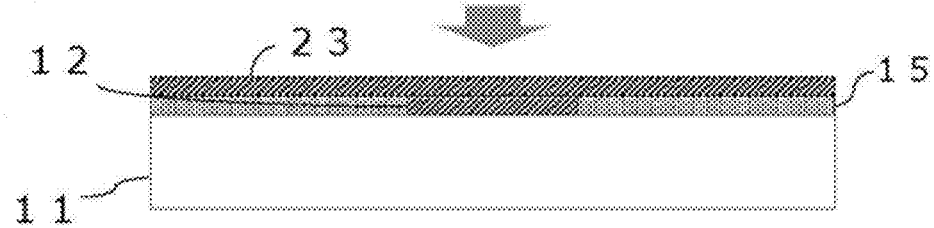

As shown in FIG. 27, after performing step 4 of the method for manufacturing the semiconductor light-emitting device described in the second embodiment, the silicon oxide layer 23 is formed as a low refractive index layer (step 5). At this time, the silicon oxide layer 23 is formed to cover both the silicon layer 15 and the dielectric layer 12 and is parallel to the surface of the heterosubstrate 11 contacting both the silicon layer 15 and the dielectric layer 12.

Figure 28:
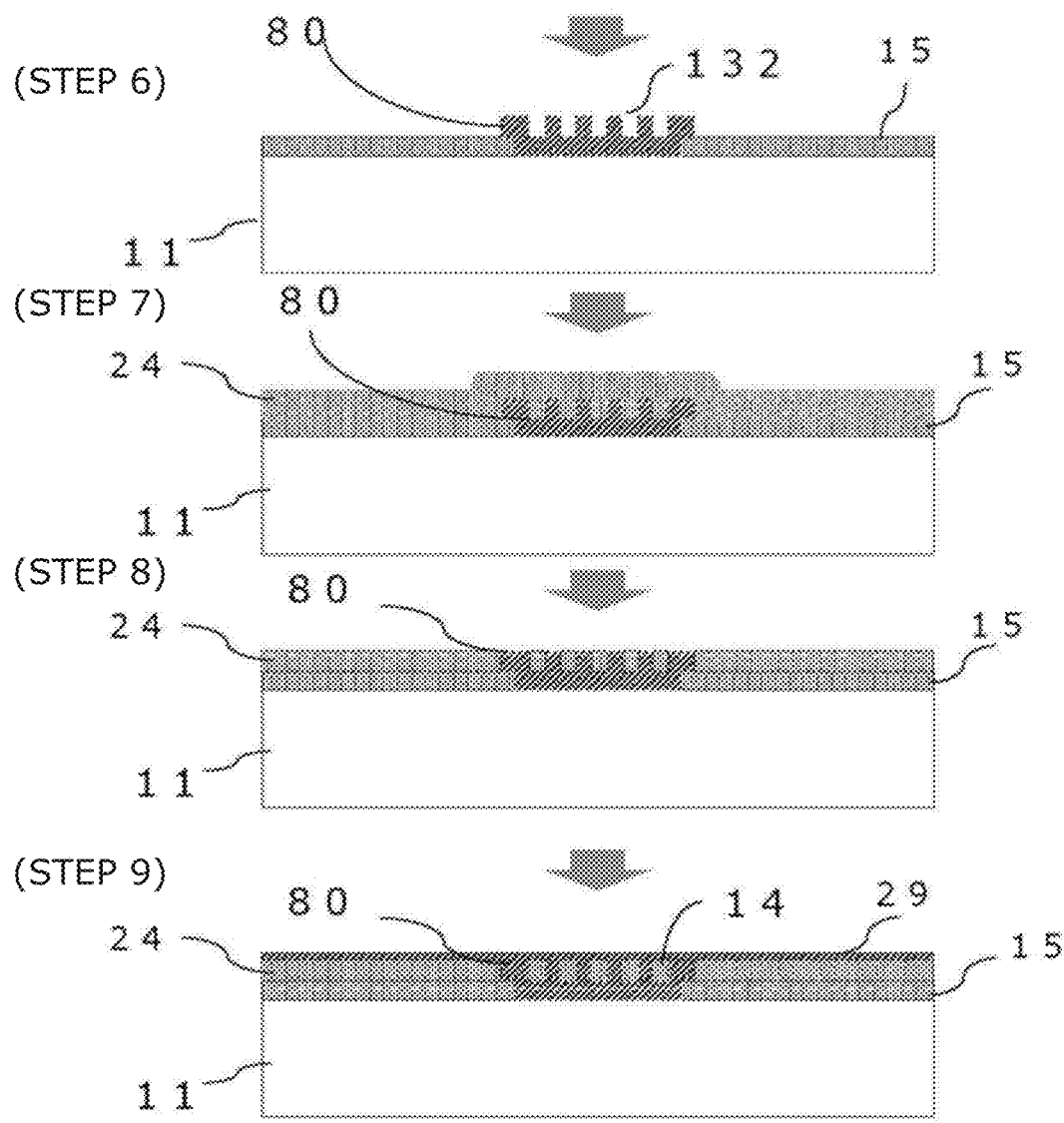
FIG. 28 is a drawing for describing steps 7 to 9 of the method for manufacturing the first semiconductor structure of the method for manufacturing the semiconductor light-emitting device according to the sixth embodiment.

Then, as shown in FIG. 28, a resist pattern of a periodic structure is formed by exposing a photoresist using photolithography, etc., to cause the silicon oxide layer 23 formed in step 5 to have a periodic structure having the openings 132 separated at a constant period; and dry etching of the silicon oxide layer 23 is performed using the resist as a mask (step 6). The openings 132 can be formed thereby. Further, the silicon oxide layer 23 that is formed in step 5 becomes the dielectric portion 80 by having the periodic structure having openings separated at the constant period in step 6.

Subsequently, the second silicon layer 24 is formed as a high refractive index layer to fill between the HCG structure formed in step 6, i.e., the openings 132 (step 7). The second silicon layer 24 is formed to cover all of the first silicon layer 15 and the dielectric portion 80 and fill the openings 132. The second silicon layer 24 also can be called a buried layer.

The second silicon layer 24 that is formed in step 7 is planarized to be coplanar with the surface of the periodic structure formed in step 6 opposite to the heterosubstrate side (step 8). Thereby, the silicon oxide layer 23 and the second silicon layer 24 each are flat and substantially coplanar.

The third silicon oxide layer 29 is formed as a low refractive index layer on the silicon oxide layer 23 and the second silicon layer 24 caused to be coplanar in step 8 (step 9). The layer that is formed in this step 9 may be a single body of a silicon oxide layer, or a silicon oxide layer and a silicon nitride layer that are overlaid. The overlaying order is arbitrary in the case where the overlaid layers of the silicon oxide layer and silicon nitride layer are used. That is, for example, either the silicon oxide layer or the silicon nitride layer may contact the planarized surfaces of the dielectric portion and the silicon layer.

The semiconductor layer described in the first embodiment can be used as the semiconductor layer including the second light-reflecting structure; and a description is therefore omitted.

The method for manufacturing the first reflective structure of the method for manufacturing the semiconductor light-emitting device according to the sixth embodiment is applicable also to the first light-diffusing structure of the semiconductor light-receiving device.

The method for manufacturing the semiconductor light-emitting device according to the embodiment includes a first process of forming a first light-reflecting structure, a process of bonding an optical semiconductor structure including an active layer on the first light-reflecting structure, a process of forming a second light-reflecting structure on the optical semiconductor structure, and a process of forming a pair of electrodes for providing a current to the optical semiconductor structure; and the first process includes a process of forming a patterned dielectric layer on a substrate, a process of forming a first high refractive index layer on the substrate and the dielectric layer, a process of planarizing the first high refractive index layer to cause the first high refractive index layer and the dielectric layer to form a first same plane, a process of forming a first low refractive index layer on the first high refractive index layer and the dielectric layer, a process of forming a periodic structure having openings separated at a constant period in the first low refractive index layer, a process of forming a second high refractive index layer on the first low refractive index layer and the first high refractive index layer and covering the periodic structure with the second high refractive index layer, a process of planarizing the second high refractive index layer to cause the second high refractive index layer and the surface of the patterned dielectric layer not contacting the substrate to form a second same plane, and a process of forming a second low refractive index layer on the second same plane. By performing the manufacturing method, the productivity can be increased because silicon oxide patterning having high patterning precision can be used.

Further, the optical semiconductor structure that is formed on the first semiconductor structure can be coplanar and in close contact over the entire surface. Thereby, the peeling at the bonding interface between the semiconductor structure body layer 13 and the optical semiconductor structure can be suppressed; and even in the case where the device is exposed to a temperature change, the stability of the device improves; and the yield and/or the productivity when manufacturing the semiconductor device can be increased.

Seventh Embodiment

The portions of the manufacturing method and the materials of the embodiment that are the same as those of the semiconductor light-emitting devices described in the first to sixth embodiments are omitted.

The first light-reflecting structure 13 is provided on the substrate 11 with the dielectric layer (e.g., the silicon oxide layer) 12 interposed. The first light-reflecting structure 13 includes the first structure body layer in which the refractive index changes periodically in the in-plane direction. The first structure body layer 13 includes a high refractive index region having a relatively high refractive index and a low refractive index region having a relatively low refractive index that are two-dimensionally arranged periodically. More specifically, the first structure body layer 13 can include a photonic crystal. In other words, in the first structure body layer 13, a high refractive index layer made of a high refractive index material is used as the main material; and a dielectric material having a lower refractive index than the main material is buried at a constant spacing in the main material. Also, in the first structure body layer 13, the main material may be formed to have a constant spacing; and a dielectric material that has a low refractive index may be disposed in portions formed at a constant spacing in the main material. Thus, the main material contacts the buried layer. Polysilicon and amorphous silicon are examples of the main material; and silicon oxide, silicon nitride, silicon oxynitride, aluminum nitride, aluminum oxide, an ITO layer, an $InTiO_x$ layer, and an $InWO_x$ layer are examples of the dielectric material. In FIG. 1, the multiple openings 132 pierce the amorphous silicon or the polysilicon included in the main material 131 at a constant spacing; and the dielectric 14 fills the openings 132.

A method for manufacturing the semiconductor device according to the embodiment will now be described. The method for manufacturing the semiconductor device according to the embodiment is an example of a method for manufacturing the semiconductor laser device shown in FIG. 1 in which the substrate 11 is a heterosubstrate formed of a different type of semiconductor material from the semiconductor of the optical semiconductor structure 16.

Figure 29:
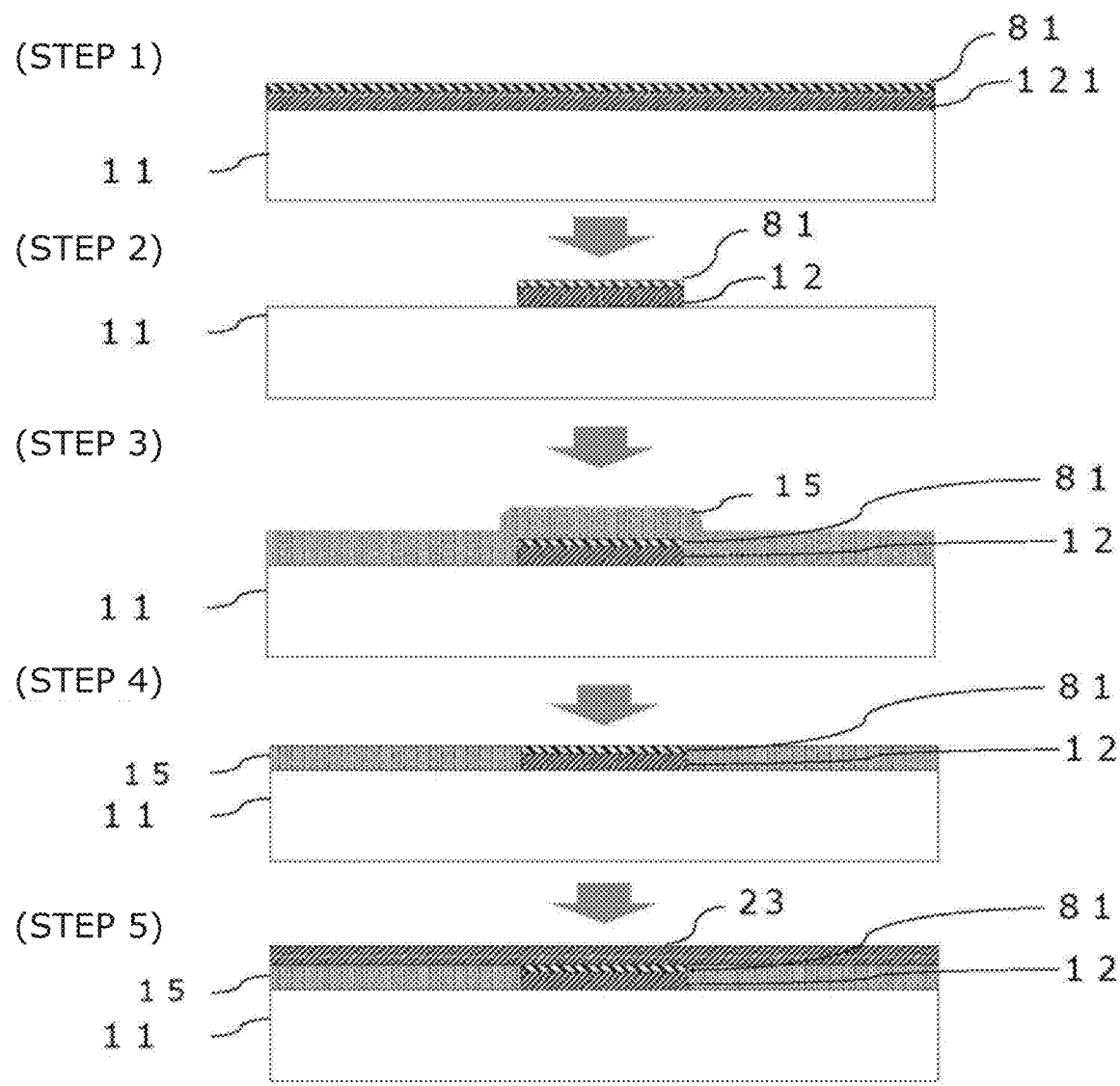
FIG. 29 is a drawing for describing steps 1 to 5 of a method for manufacturing a first semiconductor structure of a method for manufacturing a semiconductor light-emitting device according to a seventh embodiment.

As shown in FIG. 29, first, the first silicon oxide layer 121 is formed as the precursor layer 121 on a heterosubstrate; and a silicon nitride layer 81 is formed on the first silicon oxide layer 121 (step 1).

A resist pattern of a periodic structure is formed on the first silicon oxide layer 121 and the silicon nitride layer 81 formed in step 1 by exposing a photoresist using photolithography, etc.; and dry etching of the first silicon oxide layer 121 and the silicon nitride layer 81 is performed using the resist as a mask (step 2). Thus, the second silicon oxide layer 121 becomes the dielectric layer 12. After the patterning of step 2, the first silicon layer 15 is formed as a high refractive index layer (step 3). The first silicon layer 15 exists on the patterned dielectric layer 12, the silicon nitride layer 81, and the heterosubstrate 11. In such a case, the first silicon layer may include poly-Si (polysilicon), amorphous silicon, etc.

The first silicon layer 15 that is formed in step 3 is planarized (step 4). At this time, the planarization is performed so that the silicon nitride layer 81 is exposed and the silicon nitride layer 81 and the first silicon layer 15 are substantially coplanar.

Then, the third silicon oxide layer 23 is formed as a low refractive index layer (step 5). At this time, the third silicon oxide layer 23 is formed to cover the silicon nitride layer and the first silicon layer. Therefore, the third silicon oxide layer 23 also is called a pre-dielectric.

Figure 30:
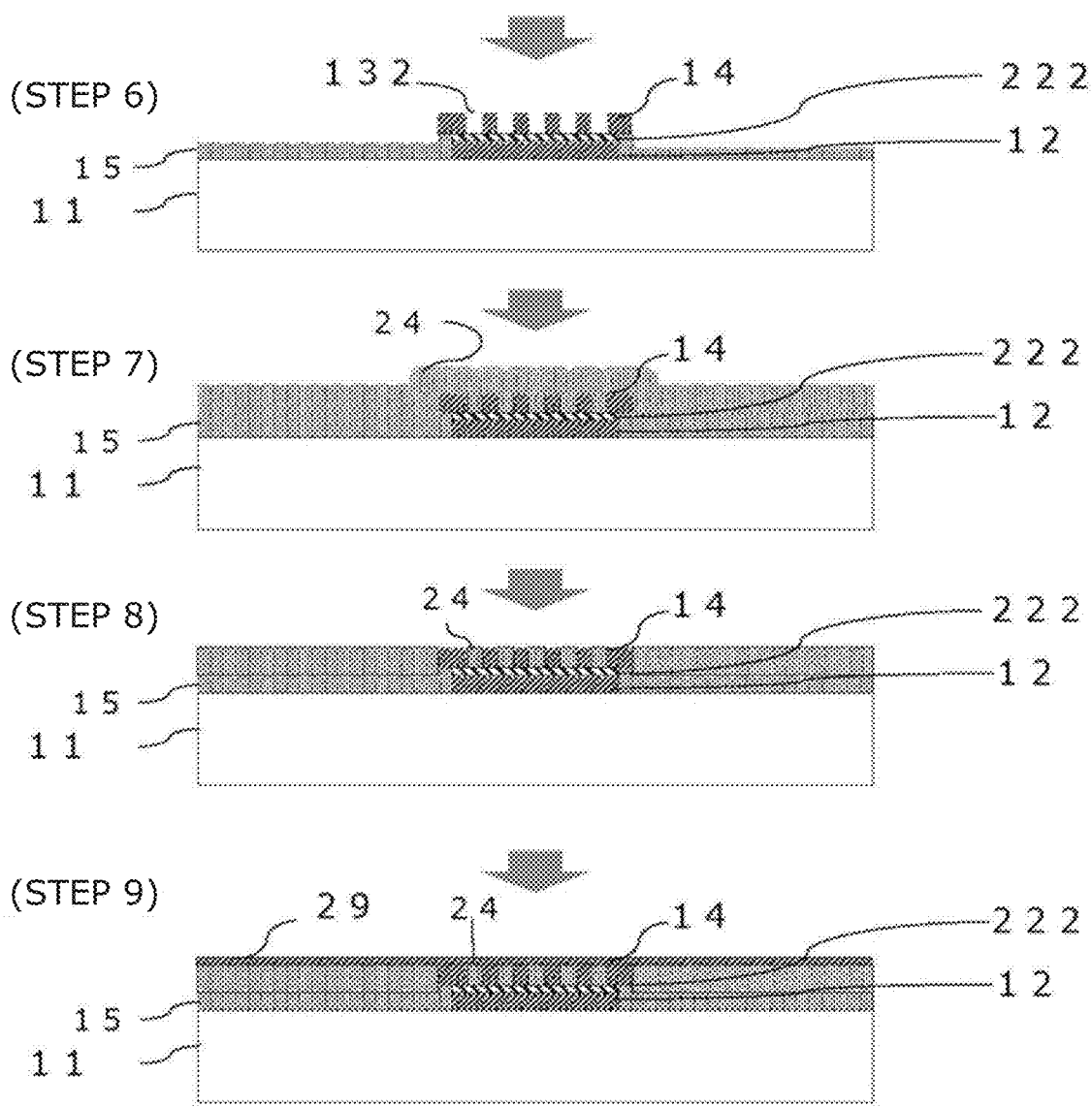
FIG. 30 is a drawing for describing steps 6 to 9 of the method for manufacturing the first semiconductor structure of the method for manufacturing the semiconductor light-emitting device according to the seventh embodiment.

As shown in FIG. 30, a resist pattern of a periodic structure is formed by exposing a photoresist using photolithography, etc., to cause the third silicon oxide layer 23 formed in step 5 to have a periodic structure having openings 132 separated at a constant period; and dry etching of the third silicon oxide layer 23 is performed using the resist as a mask (step 6). Thereby, the openings 132 are formed in the third silicon oxide layer 23. Thereby, the dielectric portion 80 is formed by the first silicon oxide layer forming the dielectric layer 12 and the third silicon oxide layer 23 forming the dielectric 14.

The second silicon layer 24 is formed to fill the openings 132 formed in step 6 (step 7). The second silicon layer 24 is formed to cover all of the first silicon layer 15 and the dielectric portion 80.

The second silicon layer 24 that is formed in step 7 is planarized to be in substantially the same plane as the surface of the periodic structure having the openings separated at the constant period formed in step 6 opposite to the heterosubstrate side (step 8). Thereby, the dielectric 14 and the second silicon layer 24 each are flat and substantially coplanar. The second silicon layer 24 also can be called a buried layer.

The fourth silicon oxide layer 29 is formed as a low refractive index layer on the dielectric 14 and the second silicon layer 24 caused to be coplanar in step 8 (step 9). The layer that is formed in this step 9 may be a single body of a silicon oxide layer, or a silicon oxide layer and a silicon nitride layer that are overlaid. The overlaying order is arbitrary in the case where the overlaid layers of the silicon oxide layer and silicon nitride layer are used. That is, for example, either the silicon oxide layer or the silicon nitride layer may contact the planarized surfaces of the dielectric 14 and the silicon layer.

MODIFICATION

Figure 31:
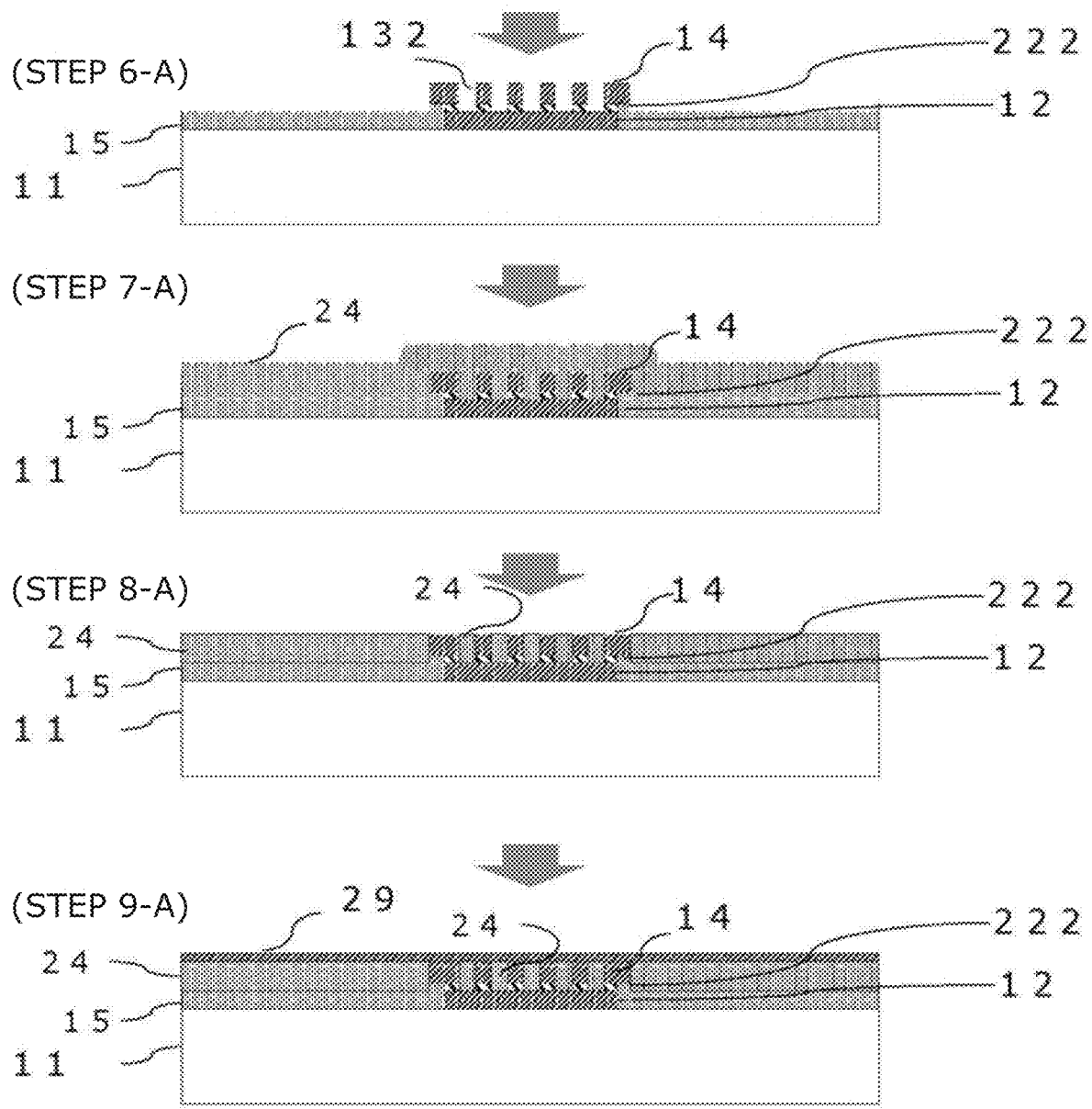
FIG. 31 is a drawing for describing steps 6 to 9 of a modification of the method for manufacturing the first semiconductor structure of the method for manufacturing the semiconductor light-emitting device according to the seventh embodiment.

A modification of the method for manufacturing the semiconductor light-emitting device according to the seventh embodiment will now be described using FIG. 31. Although step 6 of the method for manufacturing the semiconductor light-emitting device according to the seventh embodiment performs patterning to cause the third silicon oxide layer 23 formed in step 5 to have the periodic structure having the openings separated at the constant period, in the modification, patterning is performed to cause the third silicon oxide layer 23 and the silicon nitride layer 222 formed in step 5 to have a periodic structure having openings separated at a constant period (step 6-A). Specifically, the patterning forms a resist pattern of a periodic structure by exposing a photoresist using photolithography, etc., on the third silicon oxide layer 23 and the silicon nitride layer 222 formed in step 5. Subsequently, a periodic structure having the openings 132 separated at a constant period is formed by performing dry etching of the third silicon oxide layer 23 and the silicon nitride layer 222 under the resist by using the resist as a mask. At this time, the silicon nitride layer 222 has the same surface area as the dielectric layer 12 as shown in FIG. 31.

The processes of step 6-A and subsequent steps are similar to step 7 to step 9 of the method for manufacturing the semiconductor light-emitting device according to the seventh embodiment. The steps are labeled as step 7-A to step 9-A for convenience.

The semiconductor layer described in the first embodiment can be used as the semiconductor layer including the second light-reflecting structure; and a description is therefore omitted.

The method for manufacturing the first reflective structure of the method for manufacturing the semiconductor light-emitting device according to the seventh embodiment is applicable also to the first light-diffusing structure of the semiconductor light-receiving device.

The method for manufacturing the semiconductor light-emitting device according to the seventh embodiment includes a first process of forming a first light-reflecting structure, a process of bonding an optical semiconductor structure including an active layer on the first light-reflecting structure, a process of forming a second light-reflecting structure on the optical semiconductor structure, and a process of forming a pair of electrodes for providing a current to the optical semiconductor structure; and the first process includes a process of forming a precursor layer on a substrate, a process of forming a silicon nitride layer on the precursor layer, a process of forming a dielectric layer by patterning the precursor layer and the silicon nitride layer, a process of forming a first high refractive index layer on the substrate, the dielectric layer, and the silicon nitride layer, a process of planarizing the first high refractive index layer, exposing the silicon nitride layer, and causing the silicon nitride layer and the first high refractive index layer to form the same plane, a process of forming a first low refractive index layer on the same plane, a process of forming a periodic structure having openings separated at a constant period by patterning the first low refractive index layer, a process of forming a second high refractive index layer on the first high refractive index layer and the first low refractive index layer and covering the periodic structure with the second high refractive index layer, a process of planarizing the second high refractive index layer and exposing a surface of the first low refractive index layer opposite to the surface contacting the silicon nitride layer, and a process of forming a second low refractive index layer on the second high refractive index layer and the first low refractive index layer. By performing the manufacturing method, the etching depth when forming the periodic structure can be controlled precisely.

Further, the optical semiconductor structure that is formed on the first semiconductor structure can be coplanar and in close contact over the entire surface. Thereby, the peeling at the bonding interface between the semiconductor structure body layer 13 and the optical semiconductor structure can be suppressed; and even in the case where the device is exposed to a temperature change, the stability of the device improves; and the yield and/or the productivity when manufacturing the semiconductor device can be increased.

Note 1

According to the embodiment, a method for manufacturing a semiconductor light-emitting device, comprising:
  a first process of forming a first light-reflecting structure;
  bonding an optical semiconductor structure on the first light-reflecting structure, the optical semiconductor structure including an active layer;
  forming a second light-reflecting structure on the optical semiconductor structure; and
  forming a pair of electrodes providing a current to the optical semiconductor structure,
    the first process including
    forming a first low refractive index layer on a substrate and patterning the low refractive index layer,
    patterning the substrate,
    forming a precursor layer on the substrate and the first low refractive index layer,
    forming a dielectric layer by planarizing the precursor layer, and exposing the substrate and causing the dielectric layer and the substrate to form substantially the same plane,
    forming a high refractive index layer on the substrate and the dielectric layer,
    forming a mask layer on the high refractive index layer,
    forming a periodic structure in the mask layer and the high refractive index layer, the periodic structure having openings separated at a constant period,
    forming a second low refractive index layer on the mask layer and filling the periodic structure with the second low refractive index layer, and
    performing chemical mechanical polishing to cause the mask layer and the second low refractive index layer to form substantially the same plane.

Note 2

According to the embodiment, the method according to Note 1, wherein a photoresist layer is used instead of the first low refractive index layer.

Note 3

According to the embodiment, the method according to Note 1, wherein
  instead of the planarizing of the dielectric layer, the exposing of the substrate, and the causing of the dielectric layer and the substrate to form substantially the same plane and the forming of the high refractive index layer on the substrate and the dielectric layer, the method comprises:
    forming a dielectric layer by planarizing the precursor layer, and causing the low refractive index layer and the dielectric layer to form substantially the same plane; and
    forming a high refractive index layer on the low refractive index layer and the dielectric layer.

Note 4

According to the embodiment, a method for manufacturing a semiconductor light-emitting device, comprising:
  a first process of forming a first light-reflecting structure;
  bonding an optical semiconductor structure on the first light-reflecting structure, the optical semiconductor structure including an active layer;
  forming a second light-reflecting structure on the optical semiconductor structure; and
  forming a pair of electrodes providing a current to the optical semiconductor structure, the first process including
forming a dielectric portion on a substrate, the dielectric portion having a periodic structure having openings separated at a constant period,
forming a high refractive index layer on the substrate and the dielectric portion,
planarizing the high refractive index layer and causing surfaces of the high refractive index layer and the dielectric portion not contacting the substrate to form substantially the same plane, the dielectric portion being patterned, and
forming a low refractive index layer on the same plane.

Note 5

According to the embodiment, a method for manufacturing a semiconductor light-emitting device, comprising:
a first process of forming a first light-reflecting structure;
bonding an optical semiconductor structure on the first light-reflecting structure, the optical semiconductor structure including an active layer;
forming a second light-reflecting structure on the optical semiconductor structure; and
forming a pair of electrodes providing a current to the optical semiconductor structure,
the first process including
forming a dielectric layer on a substrate, the dielectric layer being patterned,
forming a first high refractive index layer on the substrate and the dielectric layer,
planarizing the first high refractive index layer and causing the first high refractive index layer and the dielectric layer to form a first same plane,
forming a first low refractive index layer on the first high refractive index layer and the dielectric layer,
forming a periodic structure in the first low refractive index layer, the periodic structure having openings separated at a constant period,
forming a second high refractive index layer on the first low refractive index layer and the first high refractive index layer, and covering the periodic structure with the second high refractive index layer,
planarizing the second high refractive index layer and causing surfaces of the second high refractive index layer and the patterned dielectric layer not contacting the substrate to form a second same plane, and
forming a second low refractive index layer on the second same plane.

Note 6

According to the embodiment, a method for manufacturing a semiconductor light-emitting device, comprising:
a first process of forming a first light-reflecting structure;
bonding an optical semiconductor structure on the first light-reflecting structure, the optical semiconductor structure including an active layer;
forming a second light-reflecting structure on the optical semiconductor structure; and
forming a pair of electrodes providing a current to the optical semiconductor structure,
the first process including
forming a precursor layer on a substrate,
forming a silicon nitride layer on the precursor layer,
forming a dielectric layer by patterning the precursor layer and the silicon nitride layer,
forming a first high refractive index layer on the substrate, the dielectric layer, and the silicon nitride layer,
planarizing the first high refractive index layer, exposing the silicon nitride layer, and causing the silicon nitride layer and the first high refractive index layer to form substantially the same plane,
forming a first low refractive index layer on the same plane,
forming a periodic structure by patterning the first low refractive index layer, the periodic structure having openings separated at a constant period,
forming a second high refractive index layer on the first high refractive index layer and the first low refractive index layer, and covering the periodic structure with the second high refractive index layer,
planarizing the second high refractive index layer and exposing a surface of the first low refractive index layer opposite to a surface of the first low refractive index layer contacting the silicon nitride layer, and
forming a second low refractive index layer on the second high refractive index layer and the first low refractive index layer.

Note 7

According to the embodiment, the method according to Note 6, further comprising forming a periodic structure by patterning the first low refractive index layer and patterning the silicon nitride layer, the periodic structure having openings separated at a constant period.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor light-emitting device, comprising:
a first process of forming a first light-reflecting structure;
bonding an optical semiconductor structure on the first light-reflecting structure, the optical semiconductor structure including an active layer;
forming a second light-reflecting structure on the optical semiconductor structure; and
forming a pair of electrodes providing a current to the optical semiconductor structure,
the first process including
forming a patterned dielectric layer on a substrate,
forming a first high refractive index layer on the substrate and the dielectric layer,
planarizing the first high refractive index layer,
forming a second high refractive index layer directly on the first high refractive index layer after the planarizing of the first high refractive index layer,
forming a mask layer on the second high refractive index layer,
forming a periodic structure in the mask layer, the second high refractive index layer, and the first high refractive index layer, the periodic structure having openings separated at a constant period,
forming a low refractive index layer on the mask layer and filling the periodic structure with the low refractive index layer, and
performing chemical mechanical polishing to cause the mask layer and the low refractive index layer to form substantially the same plane.

2. The method according to claim 1, wherein the first high refractive index layer is planarized so that the dielectric layer is not exposed.

3. The method according to claim 1, wherein the second light-reflecting structure is formed by alternately stacking first and second semiconductor layers having different refractive indexes.

4. The method according to claim 1, further comprising
forming a trench surrounding a region in the substrate, the region corresponding to a region of the first light-reflecting structure, and
forming a metal inside the trench.

5. The method according to claim 1, further comprising
forming a first thermally conductive dielectric layer between the substrate and the first light-reflecting structure, and
forming a second thermally conductive dielectric layer between the first light-reflecting structure and the optical semiconductor structure.

6. A method for manufacturing a semiconductor light-emitting device, comprising:
a first process of forming a first light-reflecting structure;
bonding an optical semiconductor structure on the first light-reflecting structure, the optical semiconductor structure including an active layer;
forming a second light-reflecting structure on the optical semiconductor structure; and
forming a pair of electrodes providing a current to the optical semiconductor structure,
the first process including
forming a patterned dielectric layer on a substrate,
forming a first high refractive index layer on the substrate and the dielectric layer,
planarizing the first high refractive index layer to expose the dielectric layer,
forming a second high refractive index layer on the first high refractive index layer and the dielectric layer after the planarizing of the first high refractive index layer,
forming a mask layer on the second high refractive index layer,
forming a periodic structure in the mask layer and the second high refractive index layer, the periodic structure having openings separated at a constant period,
forming a low refractive index layer on the mask layer and filling the periodic structure with the low refractive index layer, and
performing chemical mechanical polishing to cause the mask layer and the low refractive index layer to form substantially the same plane.

7. The method according to claim 6, wherein the second light-reflecting structure is formed by alternately stacking first and second semiconductor layers having different refractive indexes.

8. The method according to claim 6, further comprising forming a trench surrounding a region in the substrate, the region corresponding to a region of the first light-reflecting structure, and forming a metal inside the trench.

9. The method according to claim 6, further comprising forming a first thermally conductive dielectric layer between the substrate and the first light-reflecting structure, and forming a second thermally conductive dielectric layer between the first light-reflecting structure and the optical semiconductor structure.

* * * * *